United States Patent
Sze et al.

(10) Patent No.: US 12,495,632 B2
(45) Date of Patent: Dec. 9, 2025

(54) SEMICONDUCTOR IMAGE SENSOR AND METHOD FOR FORMING THE SAME

(71) Applicant: TAIWAN SEMICONDUCTOR MANUFACTURING COMPANY LTD., Hsinchu (TW)

(72) Inventors: Jhy-Jyi Sze, Hsin-Chu (TW); Yi-Shin Chu, Hsinchu (TW); Yin-Kai Liao, Taipei (TW); Hsiang-Lin Chen, Hsinchu (TW); Sin-Yi Jiang, Hsinchu (TW); Kuan-Chieh Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 985 days.

(21) Appl. No.: 17/461,118

(22) Filed: Aug. 30, 2021

(65) Prior Publication Data
US 2023/0069164 A1 Mar. 2, 2023

(51) Int. Cl.
*H10F 39/10* (2025.01)
*H10F 39/00* (2025.01)

(52) U.S. Cl.
CPC ......... *H10F 39/809* (2025.01); *H10F 39/018* (2025.01); *H10F 39/811* (2025.01)

(58) Field of Classification Search
CPC ........ H10K 50/11; H10K 50/15; H10K 50/16; H10K 50/171; H10K 2101/30;
(Continued)

(56) References Cited

U.S. PATENT DOCUMENTS

2011/0249254 A1* 10/2011 Ruggiero ........... G01N 15/0205
356/51
2013/0075607 A1* 3/2013 Bikumandla ..... H01L 27/14636
257/E31.127
(Continued)

FOREIGN PATENT DOCUMENTS

| TW | 200524168 A | 7/2005 |
|---|---|---|
| TW | 200711181 A | 3/2007 |
| TW | 201448188 A | 12/2014 |
| TW | 201840030 A | 11/2018 |

OTHER PUBLICATIONS

English Abstract of TW 201840030 A.
U.S. Pat. No. 8,138,502 B2 is the US counterpart of TW 200711181 A.
(Continued)

*Primary Examiner* — Moin M Rahman
(74) *Attorney, Agent, or Firm* — WPAT LAW; Anthony King

(57) ABSTRACT

A semiconductor image sensor includes a first substrate including a first front side and a first back side, a second substrate including a second front side and a second back side, a third substrate including a third front side and a third back side, a first interconnect structure, and a second interconnect structure. The first substrate includes a layer and a first light-sensing element in the layer. The layer includes a first semiconductor material, and the first light-sensing element includes a second semiconductor material. The second substrate is bonded to the first substrate with the second front side facing the first back side. The third substrate is bonded to the first substrate with the third front side facing the first front side. The first interconnect structure and the second interconnect structure are disposed between the first front side and the third front side.

20 Claims, 21 Drawing Sheets

(58) Field of Classification Search
CPC ......... H10K 2101/40; H10K 2102/351; H10K 50/852; H10K 59/35; H10K 59/12; H10K 50/156; H10K 2101/00; H10K 30/88; H10K 30/87; B60K 37/02; B60K 2370/1523; B60K 2370/331; B60K 2370/52; B60R 1/00; H10F 39/8037; H10F 39/199; H10F 30/21; H10F 30/221; H10F 30/2218; H10F 30/26; H10F 39/802; H10F 39/8057; H10F 39/8067; H10F 77/40; H10F 30/288; H10F 30/289; H10F 77/12–1285; H10F 71/00–1395; H10F 77/933; H10F 77/957–959; H10F 77/50; H10F 77/496; H10F 77/413; H10F 77/407; H10F 77/703; H10F 77/707; H10F 39/18–1898; H10F 39/182–1825; H10F 39/184–1847; H10F 39/186–1865; H10F 39/189–1898; H10F 39/809; H10F 39/018; H10F 39/811; H10F 39/011; G01S 7/4863; G01S 17/10; G01S 17/894

See application file for complete search history.

(56) References Cited

U.S. PATENT DOCUMENTS

| | | | |
|---|---|---|---|
| 2013/0168792 A1* | 7/2013 | Haddad | H01L 27/1467 257/432 |
| 2019/0165025 A1* | 5/2019 | Jhy-Jyi | H10F 39/8053 |
| 2020/0105812 A1* | 4/2020 | Sze | H01L 27/14643 |

OTHER PUBLICATIONS

U.S. Pat. No. 8,692,358 B2 is the US counterpart of TW 201448188 A.

U.S. Pat. No. 7,241,666 B2 is the US counterpart of TW 200524168 A.

\* cited by examiner

20

- 201 Receiving a first substrate having a first front side and a first back side opposite to the first front side, wherein the first substrate includes a first light-sensing element, and a first interconnect structure disposed over the first front side of the first substrate

- 202 Receiving a second substrate having a second front side and a second back side opposite to the second front side, wherein the second substrate includes a second interconnect structure disposed over the second front side of the second substrate

- 203 Bonding the first interconnect structure to the second interconnect structure

- 204 Bonding the first substrate to a third substrate comprising a third front side and a third back side opposite to the third front side with the first back side facing the third front side

FIG. 3

SEMICONDUCTOR IMAGE SENSOR AND METHOD FOR FORMING THE SAME

BACKGROUND

Digital cameras and other imaging devices employ image sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. One type of image sensor commonly used in optical imaging devices is a back side illumination (BSI) image sensor. BSI image sensor fabrication can be integrated into conventional semiconductor processes for low cost, small size, and high integration. Further, BSI image sensors have low operating voltage, low power consumption, high quantum efficiency and low readout noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 shows a flowchart representing a method for forming a semiconductor image sensor according to aspects of the present disclosure.

DETAILED DESCRIPTION

Figure 1:
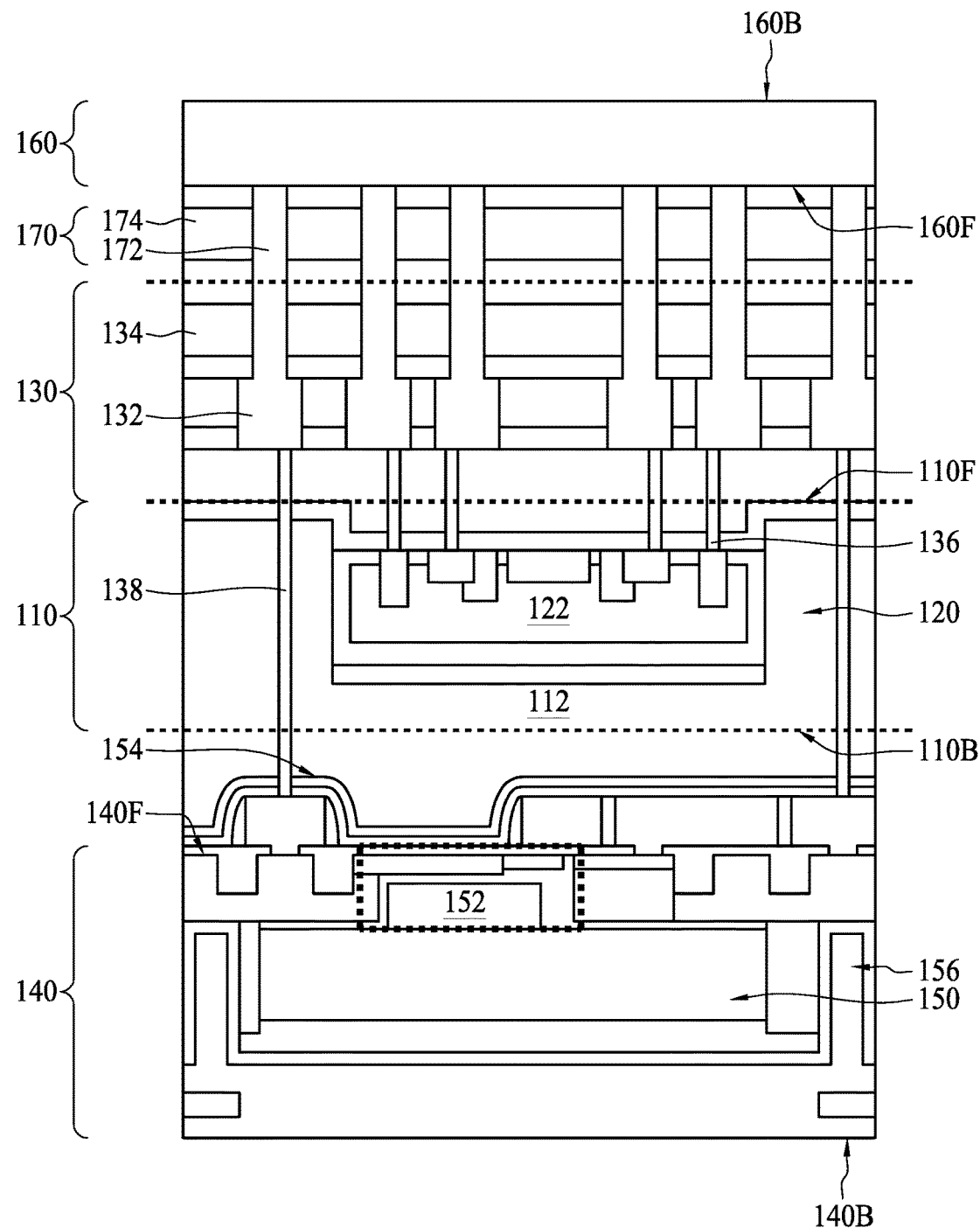
FIG. 1 is a schematic drawing illustrating a semiconductor image sensor according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A semiconductor image sensor includes an array of pixel sensors. Typically, the pixel sensors are configured to receive electromagnetic radiation and convert the electromagnetic radiation into electrical charges. For the most part, electromagnetic radiation sensed in an outdoor or indoor setting in the visible, near infrared (NIR) and shortwave infrared (SWIR) spectrums results from reflection. In some embodiments, different pixel sensors are therefore provided for different spectrums. For example, image-sensing devices are provided to receive the visible light and to capture an image of an object, while depth-sensing devices are provided to receive infrared (IR), NIR, and/or SWIR to determine a distance between an image sensor and the object. A composite pixel, including the different sensing devices, is needed to determine the distance to the object and capture the image of the object. In other words, a composite image sensor serving multiple purposes for detecting a wide range of wavelengths of light is needed. Further, prevention of polluted NIR/SWIR signals due to long-wavelength visible light, and NIR/SWIR background cancellation capability to prevent color fidelity loss in visible imaging, are both required.

The present disclosure therefore provides a composite semiconductor image sensor including an image-capturing device and a depth-sensing device. In some embodiments, the image-capturing device includes visible-light-sensing devices, while the depth-sensing device includes NIR/SWIR-sensing devices. Further, the NIR/SWIR-sensing devices uses a semiconductor material such as germanium providing greater absorption of NIR/SWIR while the visible-light-sensing device uses a semiconductor material such as silicon ensuring a greater absorption of the visible light. The present disclosure further provides methods for forming the semiconductor image sensor that improves integration of the image-capturing devices and the depth-sensing devices.

In some embodiments, the depth-sensing device can be a time-of-flight (ToF) sensor. Typically, there are two types of ToF sensors: direct ToF (d-ToF) sensors and indirect ToF (i-ToF) sensors. The d-ToF sensor measures the time the light takes to travel from the illumination unit (such as a laser or an LED) to the object and back to the sensor, while the i-ToF sensor emits a continuous modulated sinusoidal light wave and measures the phase difference between outgoing and incoming signals. In some embodiments, the d-ToF sensor can include a single photon avalanche diode (SPAD), but the disclosure is not limited thereto. In some embodiments, the i-ToF sensor can include an avalanche photodiode (APD), but the disclosure is not limited thereto. In some embodiments, the d-ToF sensor can be adopted in the composite semiconductor image sensor. In some alternative embodiments, the i-ToF sensor can be adopted in the composite semiconductor image sensor. It should be noted that the composite semiconductor image sensor provided by the present disclosure provides increased design flexibility and increased placement flexibility. It should also be noted that the depth-sensing device includes a light-sensing element configured to generate electrical signals from electromagnetic radiation within a first range of wavelengths (i.e., in a range of approximately 700 nanometers to approximately 1 millimeter). In some embodiments, the light-sensing element includes a semiconductor material such as germanium because germanium has better absorption within the first range of wavelengths. In the following description, a ToF sensor including the Ge-containing light-sensing element can be referred to as a Ge ToF sensor, and an APD sensor including the Ge-containing light-sensing element can be referred to as a Ge APD sensor.

In some embodiments, the image capturing device can be a four-transistor CMOS image sensor (4T CIS), a single photon avalanche diode (SPAD) sensor, or another suitable sensor. It should be note that such image capturing devices can be adopted in the semiconductor image sensor according to different product requirements. Therefore, the composite semiconductor image sensor of the disclosure provides increased design flexibility and increased placement flexibility. It should be noted that the image-capturing device includes a light-sensing element configured to generate electrical signals from electromagnetic radiation within a second range of wavelengths (i.e., in a range of approximately 400 nanometers to approximately 700 nanometers). In some embodiments, the light-sensing element includes a semiconductor material such as silicon because silicon has better absorption within the second range of wavelengths. In the following description, a CIS including the Si-containing light-sensing element can be referred to as a Si CIS, and a SPAD sensor including the Si-containing light-sensing element can be referred to as a Si SPAD sensor.

Figure 2:
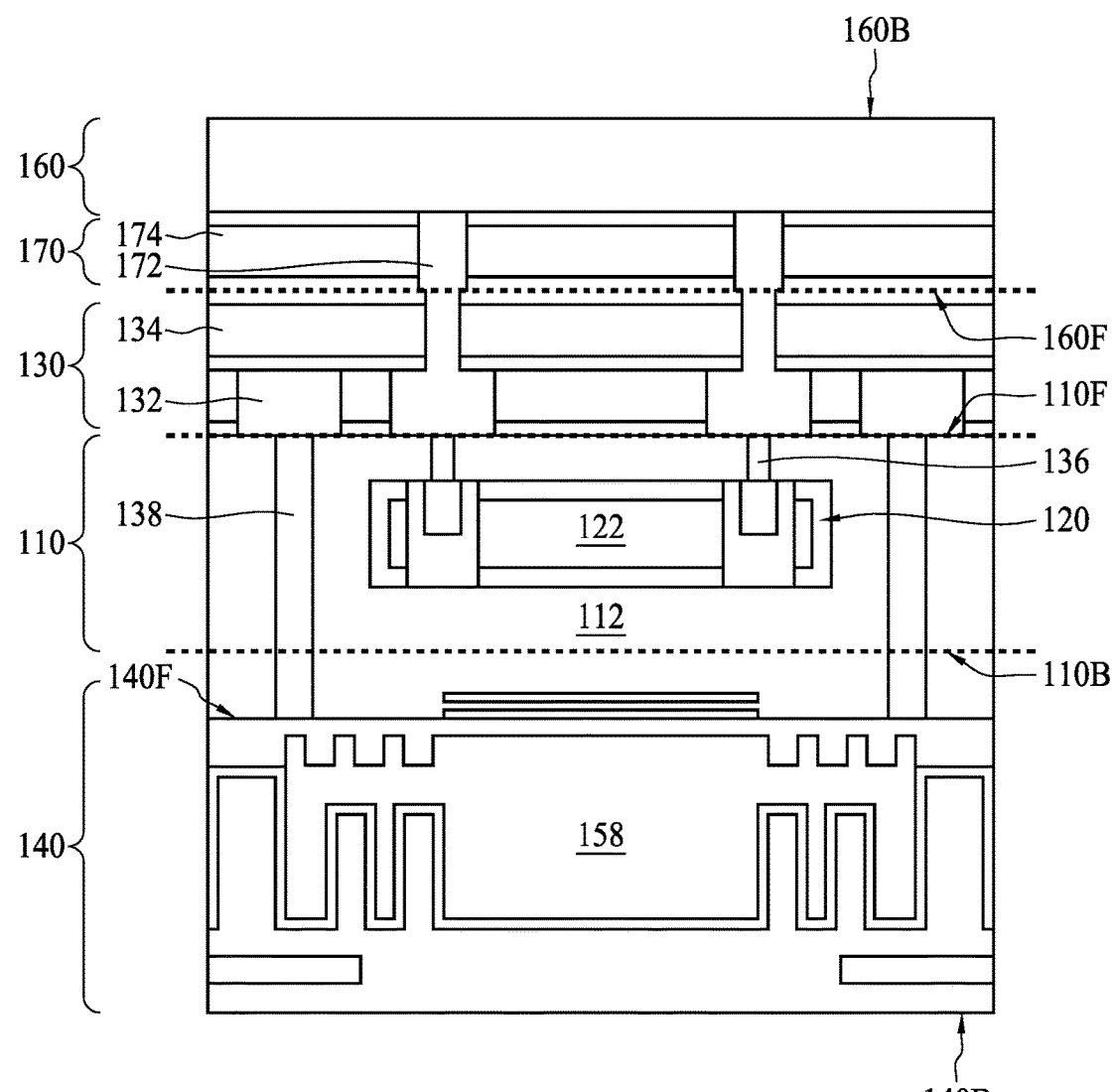
FIG. 2 is a schematic drawing illustrating a semiconductor image sensor according to aspects of the present disclosure.

FIGS. 1 and 2 are schematic drawings respectively illustrating a semiconductor image sensor according to aspects of the present disclosure. It should be noted that same elements in FIGS. 1 and 2 are depicted by the same numerals. In some embodiments, the semiconductor image sensor 100 includes a substrate 110 including a front side 110F and a back side 110B opposite to the front side 110F. In some embodiments, the substrate 110 can include a semiconductor substrate such as an epitaxial silicon substrate. The substrate 110 can include at least a sensing device. In some embodiments, the sensing device can be a depth-sensing device. Further, the depth-sensing device includes a light-sensing element 120. The light-sensing element 120 is disposed to receive light with a predetermined wavelength. In some embodiments, the sensing devices can be operated to sense NIR and/or SWIR of the incident light, and therefore the light-sensing element 120 can include a germanium layer 122 that has greater NIR/SWIR absorption. In some embodiments, the depth-sensing device can be a Ge ToF sensor as shown in FIG. 1 or a Ge APD sensor as shown in FIG. 2; however other suitable sensors can be adopted according to different product requirements.

In some embodiments, an interconnect structure 130 is disposed over the front side 110F of the substrate 110. In some embodiments, the substrate 110 can be described as comprising the interconnect structure 130. The interconnect structure 130 includes a plurality of BEOL metallization layers 132 stacked within dielectric layers 134. Further, the light-sensing element 120 of the sensing device can be electrically connected to the interconnect structure 130 by connecting structures 136, but the disclosure is not limited thereto. In some embodiments, the dielectric layers 134 can include a low-k dielectric material (i.e., a dielectric material with a dielectric constant less than 3.9) or an oxide, but the disclosure is not limited thereto. The BEOL metallization layers 132 may include a metal such as Cu, W, or Al, but the disclosure is not limited thereto.

The semiconductor image sensor 100 further includes a substrate 140 having a front side 140F and a back side 140B opposite to the front side 140F. The substrate 140 is coupled and bonded to the substrate 110 with the front side 140F of the substrate 140 facing the back side 110B of the substrate 110. In some embodiments, the substrate 140 includes at least a sensing device. In some embodiments, the sensing device can be an image-capturing device. Further, the image-capturing device includes a light-sensing element 150. The light-sensing element 150 is disposed to receive light with a predetermined wavelength. In some embodiments, the sensing devices can be operated to sense visible light. It should be noted that the light-sensing element 150 includes a semiconductor material different from that of the light-sensing element 120. For example, the light-sensing element 150 can include a silicon layer 152. In some embodiments, different doped regions can be formed in the silicon layer 152, as emphasized by the dotted line in FIG. 1. Accordingly, the sensing device can be a Si CIS, but the disclosure is not limited thereto. Further, in such embodiments, at least a transistor 154 is disposed over the front side 140F of the substrate 140. Further, the transistor 154 is coupled to the light-sensing element 150. In such embodiments, the transistor 154 can be disposed between the light-sensing element 150 and the back side 110B of the substrate 110. Alternatively, the transistor 154 can be disposed between the light-sensing element 150 and the light-sensing element 120.

Referring to FIG. 1, in some embodiments, the semiconductor image sensor 100 further includes a plurality of isolation structures 156, such as deep-trench isolation (DTI) structures, disposed in the substrate 140 to provide optical isolation between neighboring sensing devices, thereby serving as a substrate isolation grid and reducing cross-talk. The semiconductor image sensor 100 further includes a connecting structure 138 that electrically connects the transistor 154 and the light-sensing element 150 to the interconnect structure 130. As shown in FIG. 1, the connecting structure 138 may penetrate the substrate 110 to contact the transistor 154, but the disclosure is not limited thereto. Additionally, in such embodiments, an optical layer including a color filter and a micro-lens can be disposed on the back side 140B of the substrate 140, though not shown. The color filter allows a predefined spectrum of incoming electromagnetic radiation to pass. In other words, the color filters are assigned to corresponding colors or wavelengths of light, and configured to filter out all but the assigned colors or wavelengths of light. For example, the color filter may include a red color filter, a green color filter or a blue color filter.

In some embodiments, the substrate 140 can include an optical structure 158 as shown in FIG. 2. In some embodiments, the optical structure 158 in the substrate 140 is substantially aligned with the light-sensing element 120 in the substrate 110, but the disclosure is not limited thereto.

Still referring to FIGS. 1 and 2, the semiconductor image sensor 100 further includes a substrate 160 including a front side 160F and a back side 160B opposite to the front side 160F. As mentioned above, the substrate 160 can be a bulk semiconductor substrate such as a bulk Si substrate, or an SOI substrate, but the disclosure is not limited thereto. In some embodiments, the substrate 160 includes readout circuits, image signal processing (ISP) circuits, and/or application-specific integrated circuits (ASIC), but the disclosure is not limited thereto. In some embodiments, an interconnect structure 170 is disposed on the front side 160F of the substrate 160 and electrically connected to such circuits. In some embodiments, the substrate 160 can be described as comprising the interconnect structure 170. Further, the substrate 160 is bonded to and coupled to the substrate 110 with the front side 160F of the substrate 160 facing the front side 110F of the substrate 110. It should be noted that in some embodiments, the bonding of the substrate 110 to the substrate 160 can be achieved by bonding the interconnect structure 130 to the interconnect structure 170. Therefore, in such embodiments, both the interconnect structure 130 and the interconnect structure 170 are disposed between the substrate 110 and the substrate 160. Further, the interconnect structure 130 and the interconnect structure 170 are disposed between the front side 110F of the substrate 110 and the front side 170F of the substrate 170. As mentioned above, the interconnect structure 170 includes a plurality of BEOL metallization layers 172 stacked within dielectric layers 174.

As mentioned above, the dielectric layers 174 can include a low-k dielectric material (i.e., a dielectric material with a dielectric constant less than 3.9) or an oxide, but the disclosure is not limited thereto. The BEOL metallization layers 172 may include a metal such as Cu, W, or Al, but the disclosure is not limited thereto.

In some embodiments, the semiconductor image sensor 100 further includes at least one bonding structure (not shown) formed by the interconnect structure 130 and the interconnect structure 170. In some embodiments, the bonding structure includes a hybrid bonding structure. For example but not limited thereto, the bonding structure can includes at least a metal-to-metal bonding interface, a metal-to-dielectric bonding interface, or a dielectric-to-dielectric bonding interface (not shown).

As shown in FIGS. 1 and 2, the semiconductor image sensor 100 is a composite semiconductor image sensor serving multiple purposes for detecting a wide range wavelengths of lights. The semiconductor image sensor 100 includes the depth-sensing device having the Ge-containing light-sensing element 120 and the image-capturing device having the Si-containing light-sensing element 150. Because the Ge-containing light-sensing element 120 is beneficial to NIR/SWIR absorption and the Si-containing light-sensing element 150 is beneficial to visible light absorption, quantum efficiency (QE) in NIR/SWIR wavelengths and visible light are both improved. In some embodiments, the semiconductor image sensor 100 is a dual-level semiconductor image sensor. As shown in FIG. 1, the substrate 110 including the depth-sensing device having the Ge-containing light-sensing element 120 is disposed between the substrate 140 including the image-capturing device having the Si-Containing light-sensing element 150 and the substrate 160, which may be referred to as an ASIC substrate. Because the light-sensing element 150 of the image-capturing device overlaps the light-sensing element 120 of the depth-sensing device, the NIR/SWIR resolution can be increased to be substantially the same as the visible light resolution. It should be noted that both the depth-sensing device and the image-capturing device of the semiconductor image sensor 100 are BSI sensors that receive incident light from the back side 140B of the substrate 140. Accordingly, NIR/SWIR and visible light enter the light-sensing elements 120 and 150 from the back side 140B of the substrate 140, and therefore the interconnect structure 130 and the interconnect structure 170, which are located between the front side 110F of the substrate 110 and the front side 160F of the substrate 160, are no longer located in the direct light path. Consequently, BEOL routing for the interconnect structures 130 and 170 can be simplified because the direct light path is not an issue for the interconnect structures 130 and 170. Further, because the ASIC substrate 160 is stacked over the substrates 110 and 140 including the light-sensing elements 120 and 150, a device on photodiode (DoF) structure can be obtained, as shown in FIGS. 1 and 2. The semiconductor image sensor 100 further mitigates photon detection efficiency (PDE) and jitter trade-off issues. Further, the substrate 110 can include a depth-sensing device according to different product requirements, the substrate 140 can include an image-capturing device according to different product requirements, and the substrate 160 can include different integrated circuits according to different product requirements, while each of the substrates 110, 140 and 160 can be designed and manufactured individually. Thus, the design and manufacturing operation of the semiconductor image sensor 100 can be further simplified.

FIG. 3 is a flowchart representing a method for forming a semiconductor image sensor 20 according to aspects of the present disclosure. In some embodiments, the method for forming the semiconductor image sensor 20 includes a number of operations (201, 202, 203 and 204). The method for forming the semiconductor image sensor 20 will be further described according to one or more embodiments. It should be noted that the operations of the method 20 may be rearranged or otherwise modified within the scope of the various aspects. It should further be noted that additional processes may be provided before, during, and after the method 20, and that some other processes may be only briefly described herein.

FIGS. 4A to 4E are schematic drawings illustrating various stages in the method for forming the semiconductor image sensor 20 according to aspects of one or more embodiments of the present disclosure. In some embodiments, the method for forming the semiconductor image sensor 20 can be used to form the semiconductor image sensor 100, but the disclosure is not limited thereto. Therefore, same elements in FIGS. 1, 2 and 4A to 4E are indicated by the same numerals, and repeated descriptions of such elements are omitted for brevity.

Figure 4A:
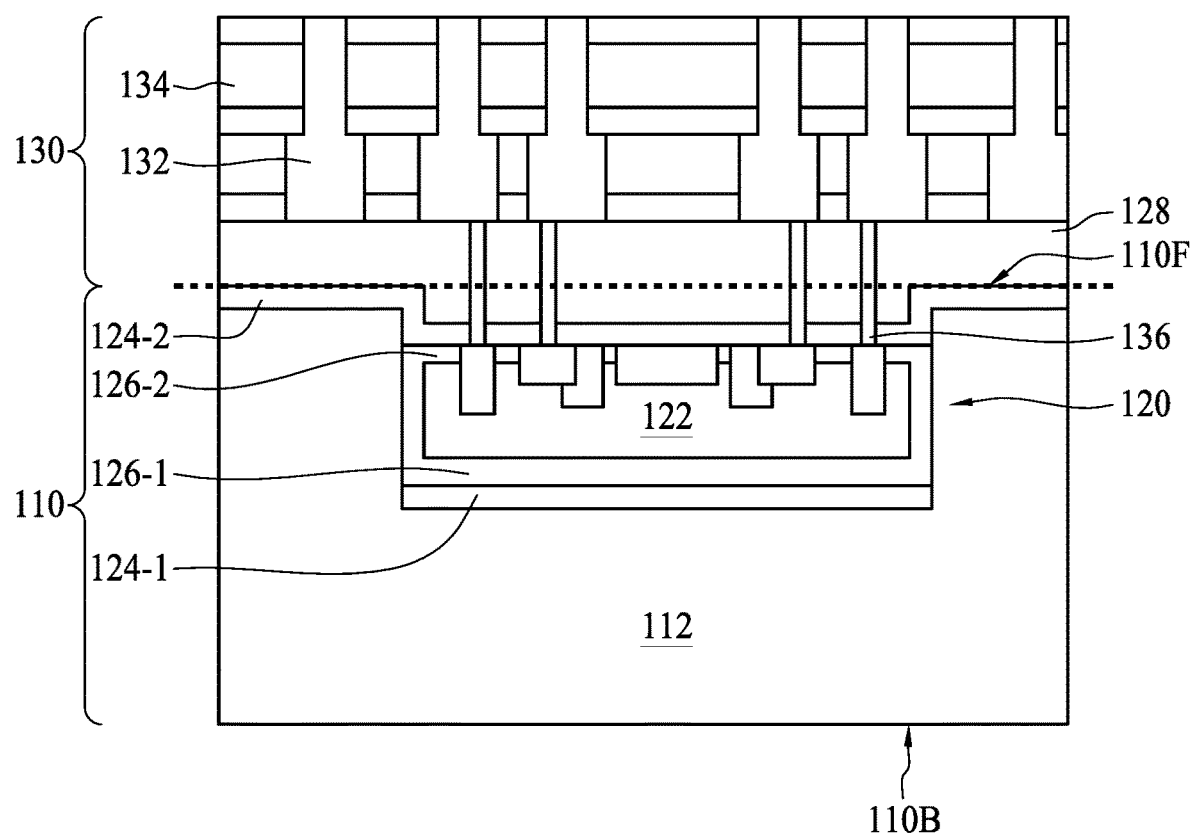
FIGS. 4A to 4E are schematic drawings of a semiconductor image sensor at various fabrication stages constructed according to aspects of the present disclosure in one or more embodiments.

In operation 201, a substrate 110 is provided or received as shown in FIG. 4A. The substrate 110 includes a front side 110F and a back side 110B opposite to the front side 110F. At least a first sensing device is formed in the substrate 110. As mentioned above, the first sensing device includes a light-sensing element 120, and the light-sensing element 120 includes a semiconductor material suitable for absorbing NIR and/or SWIR radiation. In some embodiments, the light-sensing element 120 includes a germanium layer 122, as shown in FIG. 4A, but the disclosure is not limited thereto.

Referring to FIG. 4A, in some embodiments, the light-sensing element 120 including the germanium layer 122 can be formed by following operations: a silicon layer 112 is received, and a recess is formed in the silicon layer 112. A passivation layer 124-1 can be formed over a bottom of the recess, and an epitaxial layer 126-1 can be formed over the passivation layer 124-1 and over sidewalls of the recess. In some embodiments, the passivation layer 124-1 can include aluminum oxide, but the disclosure is not limited thereto. In some embodiments, the epitaxial layer 126-1 can be a p-type epitaxial silicon layer, but the disclosure is not limited thereto. In some embodiments, an epitaxial germanium layer serving as a buffer layer can be formed over the epitaxial silicon layer 126-1, though not shown. In some embodiments, the epitaxial germanium layer 122 is formed in the recess. In some embodiments, the buffer layer between the epitaxial germanium layer 122 and the epitaxial silicon layer 126-1 helps to mitigate an issue of lattice mismatch between silicon and germanium, such that the epitaxial germanium layer 122 is formed as a low-defect epitaxial layer suitable for absorbing photons. In some embodiments, an epitaxial silicon layer 126-2 can be formed over the epitaxial germanium layer 122. Further, a plurality of doped regions can be formed in the epitaxial germanium layer 122 and the epitaxial silicon layer 126-2 for controlling the sensing device. Another passivation layer 124-2 can be formed over the epitaxial silicon layer 126-2. In some embodiments, a plurality of sensing devices can be formed in the substrate 110, and each of the sensing devices includes a light-sensing element 120 as shown in FIG. 4A. Further, the light-sensing elements 120 can be separated from each other by the silicon layer 112, but the disclosure is not limited thereto.

In some embodiments, the light-sensing element 120 including the germanium layer 122 can be formed by following operations: a silicon layer 112 is received. A passivation layer 124-1, an epitaxial silicon layer 126-1, a buffer layer 125 (shown in FIG. 6A), an epitaxial germanium layer 122, an epitaxial layer 126-2 and another passivation layer 124-2 can be sequentially formed over the silicon layer 112. A patterning operation can be performed to pattern the abovementioned layers to form a plurality of islands (not shown), and each of the islands includes the above mentioned layers. Another epitaxial silicon layer or epitaxial germanium layer can be formed between the islands in order to isolate the islands from each other. A plurality of doped regions can be formed in each island such that a plurality of light-sensing elements 120 can be obtained. In some embodiments, this approach is able to provide light-sensing elements 120 more suitable for pixels with pitch less than 5 micrometers.

Referring to FIG. 4A, the light-sensing element 120 is formed near the front side 110F of the substrate 110. In some embodiments, an interlayer dielectric (ILD) layer 128 can be formed over the front side 110F of the substrate 110. The substrate 110 further includes an interconnect structure 130 disposed over the front side 110F and over the ILD layer 128. In some embodiments, the interconnect structure 130 includes a plurality of BEOL metallization layers 132 stacked within dielectric layers 134. Further, the light-sensing element 120 is electrically connected to the interconnect structure 130 by connecting structures 136.

Figure 4B:
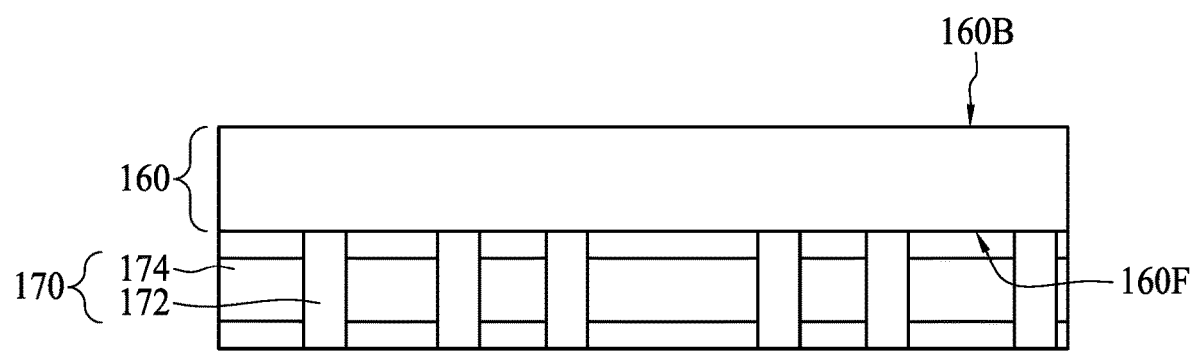

In operation 202, a substrate 160 can be provided or received, as shown in FIG. 4B. The substrate 160 includes a front side 160F and a back side 160B opposite to the front side 160F. In some embodiments, the substrate 160 includes readout circuits, image signal processing (ISP) circuits, and/or application-specific integrated circuits (ASIC), but the disclosure is not limited thereto. In some embodiments, an interconnect structure 170 is disposed over the front side 160F of the substrate 160 and electrically connected to the circuits. As mentioned above, the interconnect structure 170 includes a plurality of BEOL metallization layers 172 stacked within dielectric layers 174.

Figure 4C:
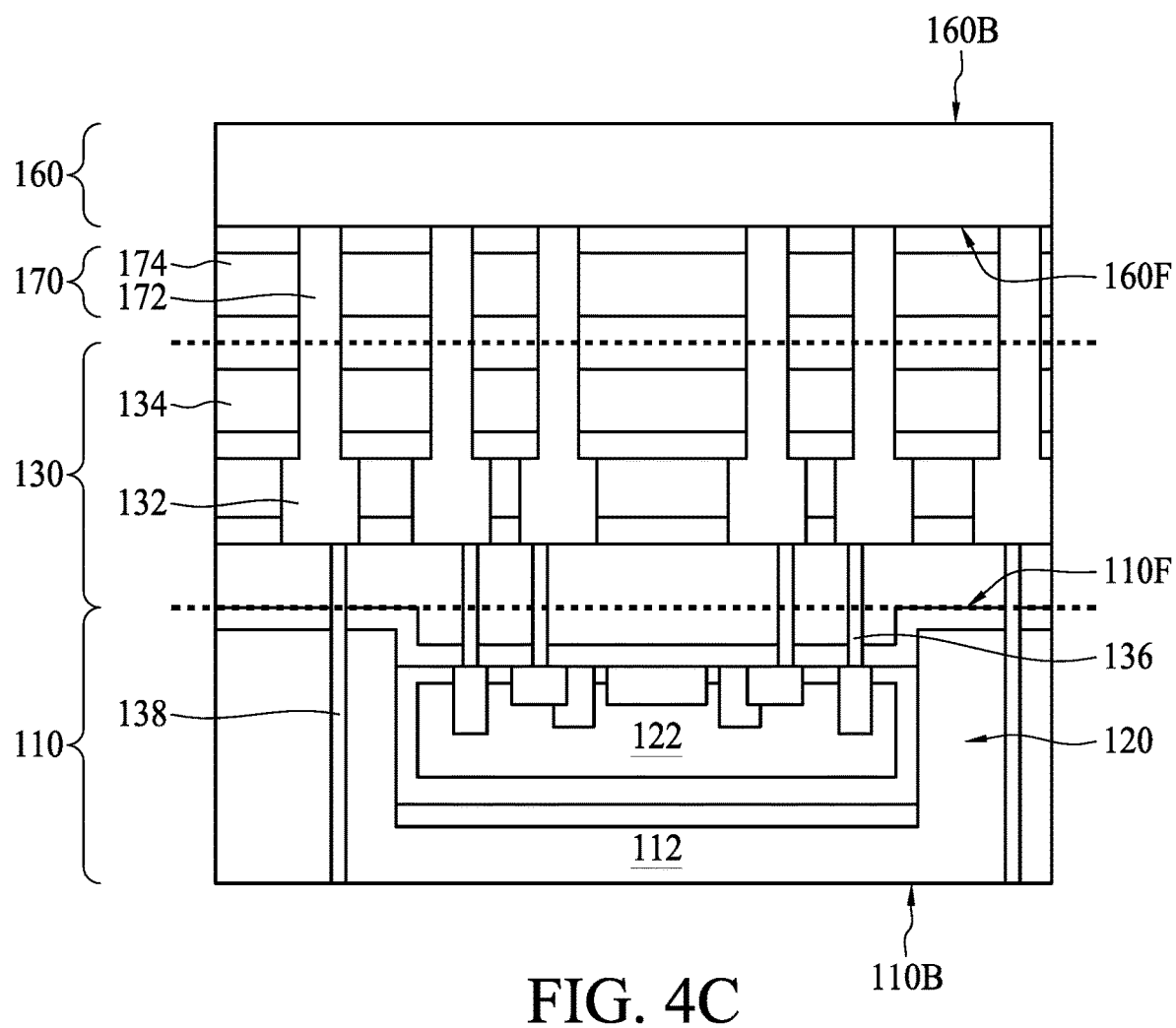

Referring to FIG. 4C, in operation 203, the interconnect structure 130 is bonded to the interconnect structure 170 such that the substrate 110 is bonded to the substrate 160. In some embodiments, the substrate 160 can be flipped over such that the front side 160F of the substrate 160 faces the front side 110F of the substrate 110. Consequently, the second interconnect structure 170 faces the interconnect structure 130. By the bonding of the interconnect structure 130 to the interconnect structure 170, the substrate 110 is bonded to the substrate 160. In some embodiments, a bonding structure can be formed by the interconnect structures 130 and 170. In some embodiments, the bonding structure can be a hybrid bonding structure including at least a metal-to-metal interface and a dielectric-to-dielectric interface. In some embodiments, the bonding structure can include a metal-to-dielectric interface.

In some embodiments, a thinning operation can be performed to thin the substrate 110 from the back side 110B of the substrate 110 after the bonding of the substrate 110 to the substrate 160. Accordingly, a thickness of the substrate 110 is reduced. It should be noted that after the thinning operation, the light-sensing element 120 is still embedded in the silicon layer 112, as shown in FIG. 4C.

In some embodiments, a plurality of connecting structures 138 penetrating the substrate 110 can be formed to connect to the interconnect structure 130 as shown in FIG. 4C. In some embodiments, the bonded substrates 110 and 160 can be flipped over, as shown in FIG. 4C, for subsequent operations.

Figure 4D:
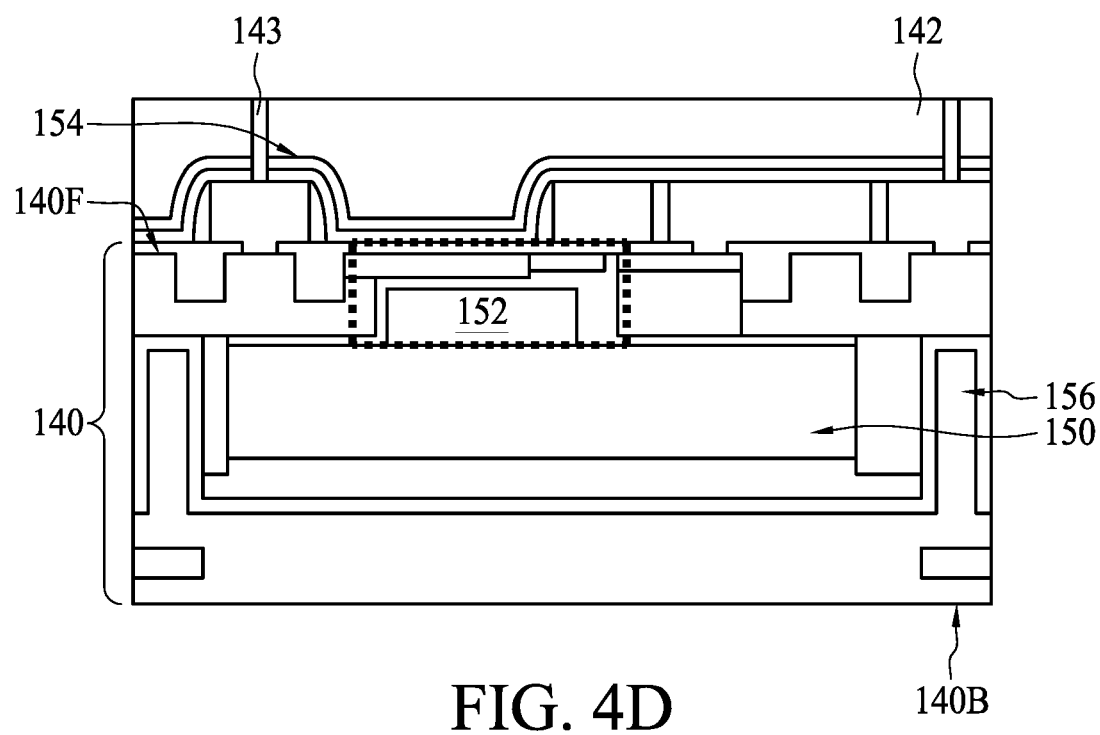

Referring to FIG. 4D, a substrate 140 is provided or received. The substrate 140 includes a front side 140F and a back side 140B opposite to the front side 140F. In some embodiments, the substrate 140 includes at least a second sensing device disposed therein. As mentioned above, the second sensing device can include a light-sensing element 150 operating to sense visible light of incident light, and the light-sensing element 150 can include a semiconductor material different from that of the light-sensing element 120 of the first sensing device. In some embodiments, the light-sensing element 120 includes a silicon layer 152, as shown in FIG. 4D. As mentioned above, in such embodiments, at least a transistor 154 can be formed over the front side 140F of the substrate 140 and configured to enable readout of the second sensing device. However, in other embodiments, the substrate 140 can include an optical structure 158 as shown in FIG. 2. In some embodiments, an ILD layer 142 can be formed over the front side 140F of the substrate 140. Further, a connecting structure 143 coupled to the transistor 154 can be formed in the ILD layer 142.

Figure 4E:
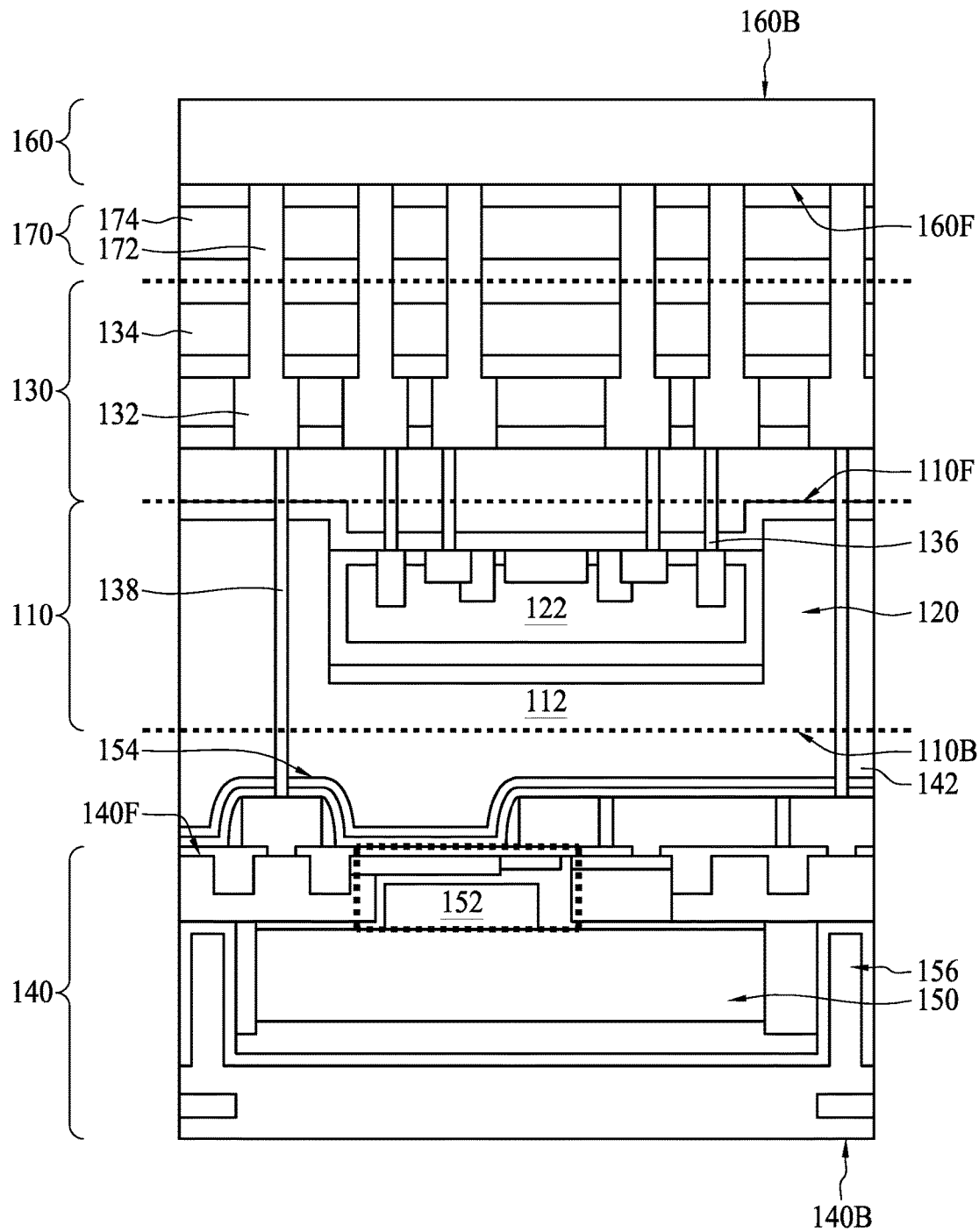

In operation 204, the substrate 110 is bonded to the substrate 140 with the back side 110B of the substrate 110 facing the front side 140F of the substrate 140, as shown in FIG. 4E. Further, the connecting structure 138 can be bonded to the connecting structure 143. To simplify the illustration, the label "143" is not indicated in FIG. 2, and the connecting structure 138 includes both the connecting structure in the substrate 110 and the connecting structure in the ILD layer 142. Accordingly, the interconnect structures 130 and 170 are electrically connected to the substrate 140 through the connecting structure 138. Additionally, the light-sensing element 120 of the first sensing device can be aligned with the light-sensing element 150 of the second sensing device. In other embodiments, the light-sensing element 120 of the first sensing device can be aligned with the optical structure 158, as shown in FIG. 2. It should be noted that the light-sensing element 120 including the Ge epitaxial layer 122 is disposed between the substrate 160 and the substrate 140.

In some embodiments, another thinning operation can be performed to thin the substrate 140 from the back side 140B after the bonding of the substrate 110 to the substrate 140. Accordingly, a thickness of the substrate 140 is reduced. As mentioned above, a plurality of isolation structures 156 such as DTI structures can be disposed in the substrate 140 to provide optical isolation between neighboring light-sensing elements 150, thereby serving as a substrate isolation grid and reducing cross-talk.

In some embodiments, an optical structure can be formed on the back side 140B of the substrate 140. In some embodiments, the optical structure can include a color filter and a micro-lens respectively aligned with the light-sensing element 150 and the light-sensing element 120, though not shown. Additionally, a plurality of low-n structures (not shown) can be disposed to surround the color filter, and the low-n structures serve as a light guide to direct or reflect light to the color filter. The micro-lenses (not shown) are used to focus incident light onto the corresponding light-sensing elements 150 and 120. As mentioned above, the color filter is assigned to corresponding colors or wavelengths of light, and accordingly the micro-lenses, the color filter and the second sensing device may be a part of an RGB image sensing system.

Still referring to FIG. 4E, thus, a dual-level composite semiconductor image sensor 100 including the image-capturing device (i.e., the visible-light-sensing device) and the depth-sensing device (i.e., the NIR/SWIR-sensing device) is obtained. According to the method for forming the semiconductor image sensor 20, integration of the substrate 110 including the depth-sensing device with the Ge-containing light-sensing element 120, the substrate 140 including the image-capturing device with the Si-containing light-sensing element 150, and the ASIC substrate 160 can be improved.

Figure 5:
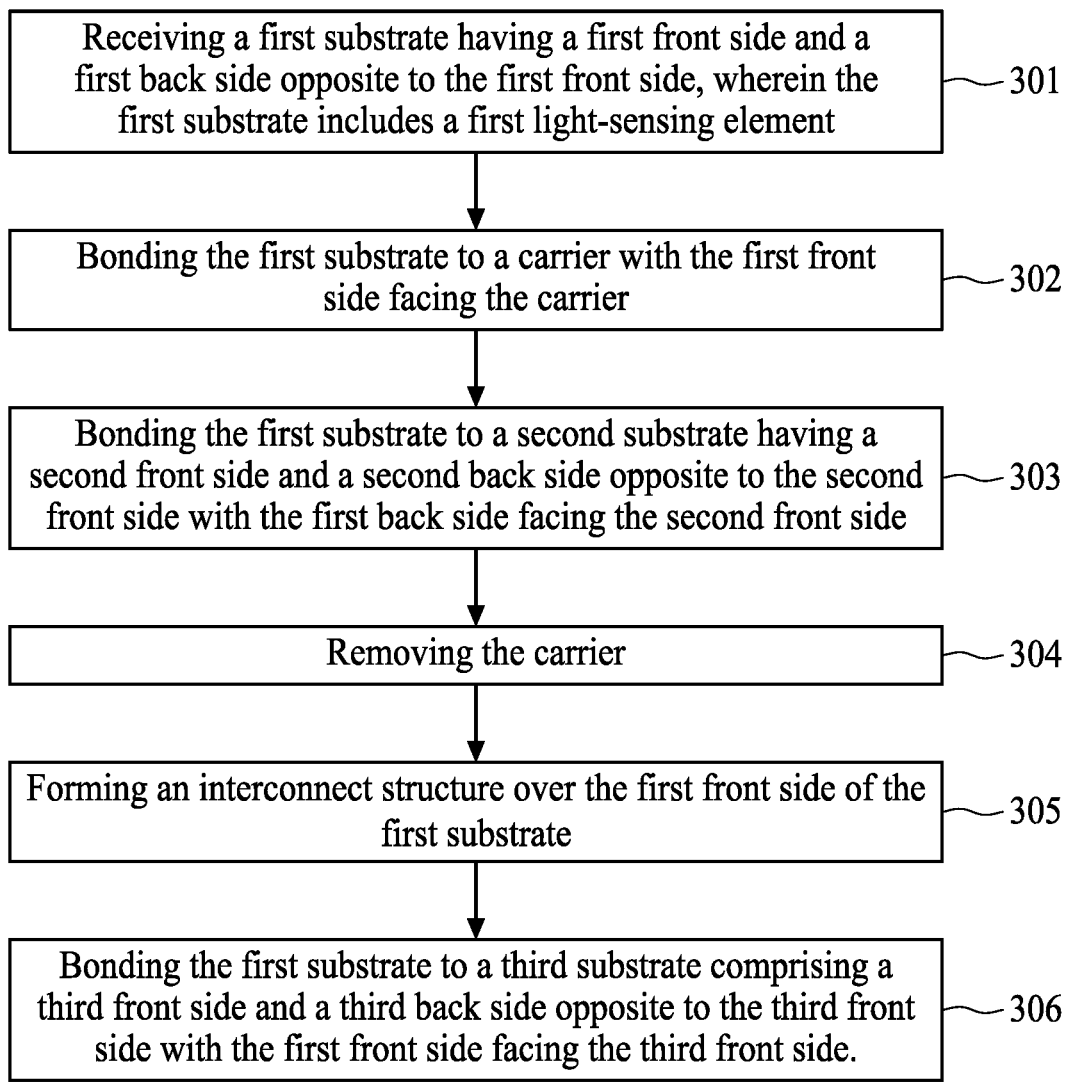
FIG. 5 shows a flowchart representing a method for forming a semiconductor image sensor according to aspects of the present disclosure.

FIG. 5 is a flowchart representing a method for forming a semiconductor image sensor 30 according to aspects of the present disclosure. In some embodiments, the method for forming the semiconductor image sensor 30 includes a number of operations (301, 302, 303, 304, 305 and 306). The method for forming the semiconductor image sensor 30 will be further described according to one or more embodiments. It should be noted that the operations of the method 30 may be rearranged or otherwise modified within the scope of the various aspects. It should further be noted that additional processes may be provided before, during, and after the method 30, and that some other processes may be only briefly described herein.

Figure 6A:
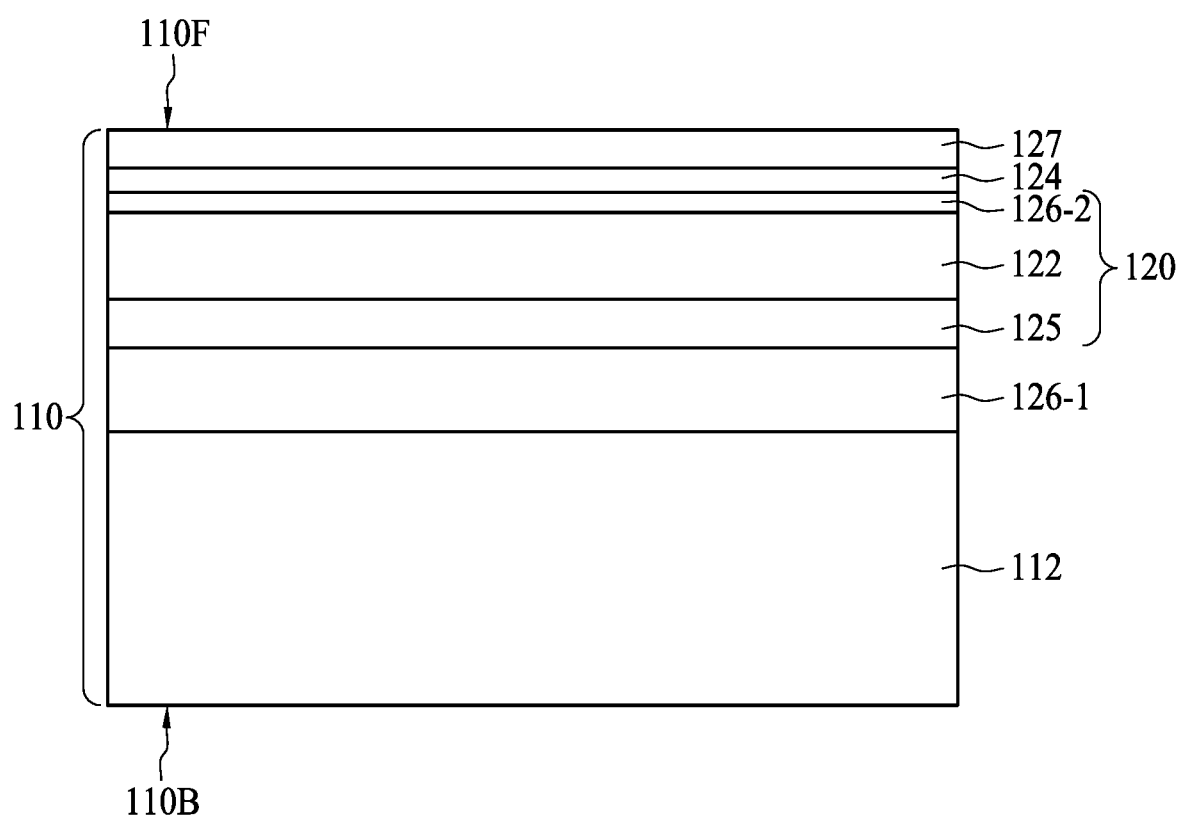
FIGS. 6A to 6F are schematic drawings of a semiconductor image sensor at various fabrication stages constructed according to aspects of the present disclosure in one or more embodiments.
Figure 6B:
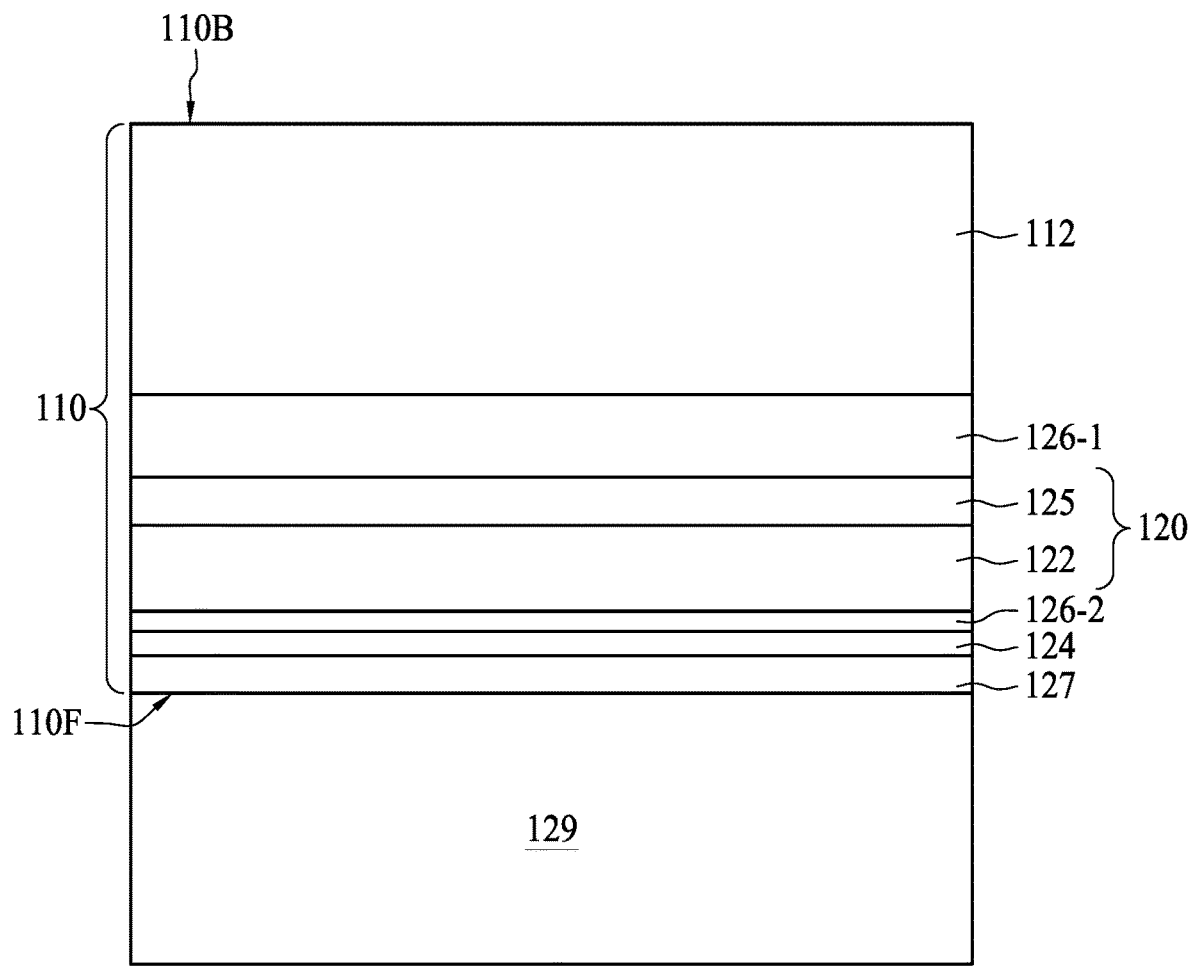
Figure 6C:
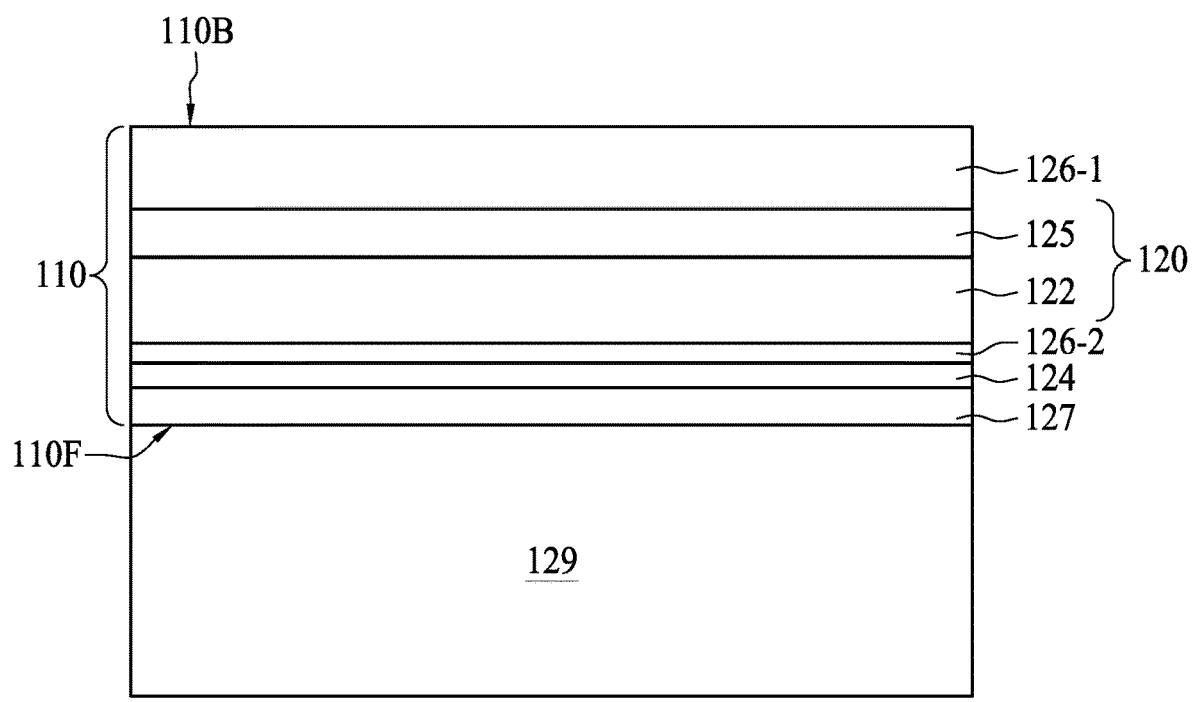

FIGS. 6A to 6F are schematic drawings illustrating various stages in the method for forming the semiconductor image sensor 30 according to aspects of one or more embodiments of the present disclosure. It should be noted that FIGS. 6A to 6C are schematic drawings illustrating a portion of a substrate. In some embodiments, the method for forming the semiconductor image sensor 30 can be used to form the semiconductor image sensor 100, but the disclosure is not limited thereto. Therefore, same elements in FIGS. 1, 2 and 6A to 6F are indicated by the same numerals, and repeated descriptions of such elements are omitted for brevity.

In operation 301, a substrate 110 is provided or received as shown in FIG. 6A. The substrate 110 includes a front side 110F and a back side 110B opposite to the front side 110F. At least a first sensing device is formed in the substrate 110. As mentioned above, the first sensing device includes a light-sensing element 120, and the light-sensing element 120 includes a semiconductor material suitable for absorb NIR and/or SWIR radiation. In some embodiments, the light-sensing element 120 includes a germanium layer 122, as shown in FIG. 6A, but the disclosure is not limited thereto.

In some embodiments, the light-sensing element 120 including the germanium layer 122 can be formed by following operations: a silicon layer 112 is received, and a first epitaxial layer 126-1 and a second epitaxial layer 125 can be formed over the silicon layer 112. In some embodiments, the first epitaxial layer 126-1 can be a p-type silicon epitaxial layer, and the second epitaxial layer 125 can be an epitaxial germanium layer, but the disclosure is not limited thereto. In some embodiments, the first epitaxial layer 126-1 and the second epitaxial layer 125 both serve as buffer layers. In some embodiments, the epitaxial germanium layer 122 is formed over the second epitaxial layer 125. In such embodiments, the buffer layers 126-1 and 125 between the epitaxial germanium layer 122 and the silicon layer 112 help to mitigate an issue of lattice mismatch between silicon and germanium, such that the epitaxial germanium layer 122 is formed to be a low-defect epitaxial layer suitable for absorbing photons. In some embodiments, an epitaxial silicon layer 126-2 can be formed over the epitaxial germanium layer 122. Further, a plurality of doped regions can be formed in the epitaxial germanium layer 122 and the epitaxial silicon layer 126-2 for controlling the sensing device. A passivation layer 124 can be formed over the epitaxial silicon layer 126-2. In some embodiments, an oxide layer 127 is formed over the passivation layer 124, as shown in FIG. 6A. In some embodiments, doped regions may be formed prior to the forming of the passivation layer 124. In some embodiments, a patterning operation may be performed after the forming of the abovementioned layers. Accordingly, islands (not shown) including the abovementioned layers and separated from each other by trenches may be obtained. In some embodiments, the trenches may be filled with dielectric materials (not shown) such that the islands are electrically isolated from each other by the dielectric materials. In some embodiments, each island is defined to form the light-sensing element 120.

Referring to FIG. 6B, in operation 302, the substrate 110 is flipped over and bonded to a carrier 129 with the front side 110F facing the carrier 129. In some embodiments, the substrate 110 can be bonded to the carrier 129 by vacuum bonding, while the oxide layer 127 serves as a bonding layer, but the disclosure is not limited thereto.

Referring to FIG. 6C, in some embodiments, the substrate 110 is thinned from the back side 110B. In some embodiments, the silicon layer 112 can be partially removed. However, in other embodiments, the silicon layer 112 can be entirely removed such that the epitaxial silicon layer 126-1 is exposed.

Figure 6D:
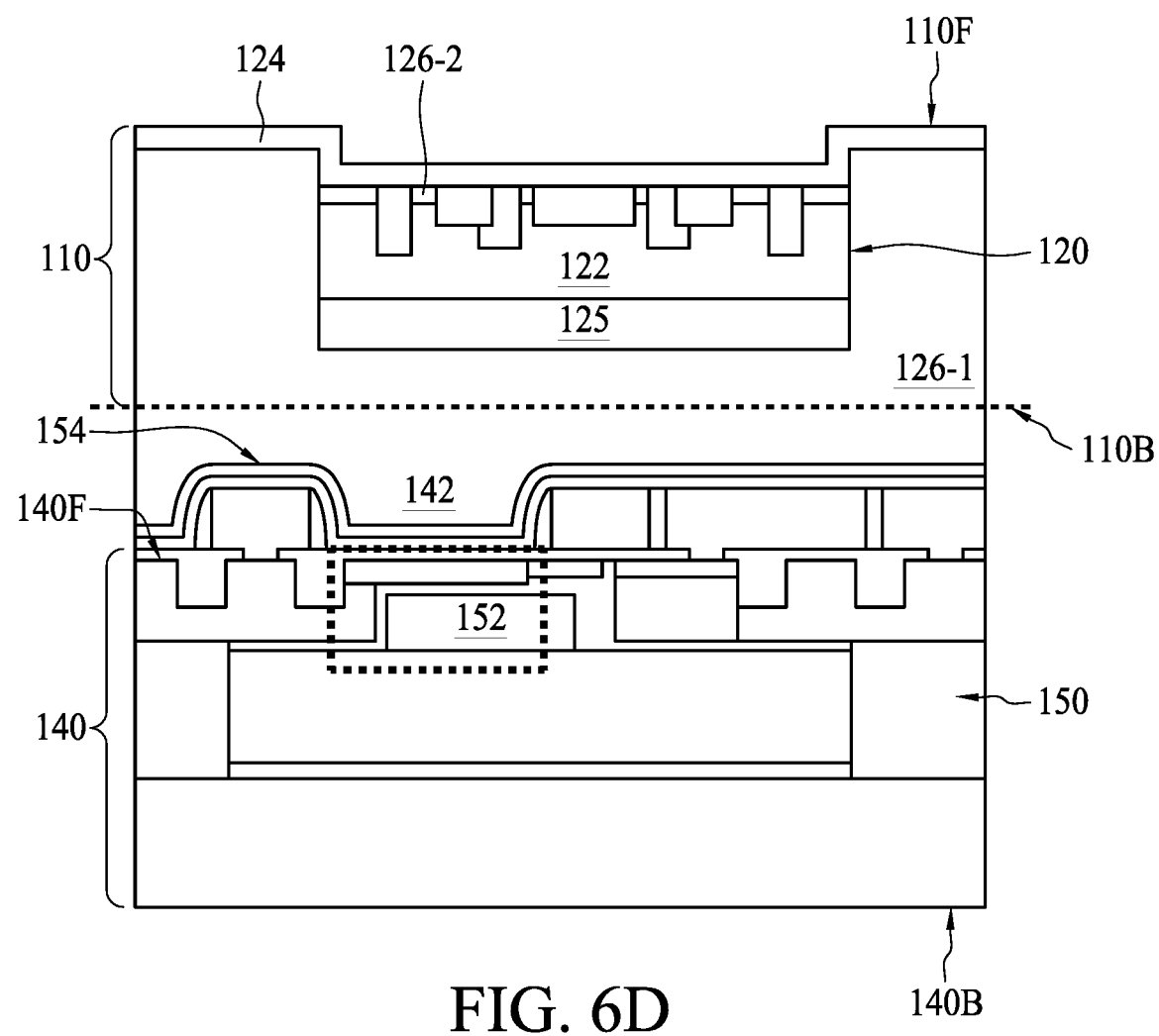

Referring to FIG. 6D, in operation 303, the substrate 110 and the carrier 129 are flipped over, and the substrate 110 is bonded to a substrate 140. In some embodiments, the substrate 140 includes a front side 140F and a back side 140B opposite to the front side 140F. The substrate 110 is bonded to the substrate 140 with the back side 110B of the substrate 110 facing the front side 140F of the substrate 140, as shown in FIG. 6D. In some embodiments, the substrate 140 includes at least a second sensing device disposed therein. As mentioned above, the second sensing device can include a light-sensing element 150 operating to sense visible light of incident light, and the light-sensing element 150 can include a semiconductor material different from that of the light-sensing element 120 of the first sensing device. In some embodiments, the light-sensing element 150 includes a silicon layer 152, as shown in FIG. 6D. As mentioned above, in such embodiments, at least a transistor 154 can be formed over the front side 140F of the substrate 140 and configured to enable readout of the second sensing device. However, in other embodiments, the substrate 140 can include an optical structure 158 as shown in FIG. 2. In some embodiments, an ILD layer 142 can be formed over the front side 140F of the substrate 140.

Referring to FIG. 6D, in some embodiments, after the bonding of the substrate 110 to the substrate 140, the carrier 129 and the oxide layer 127 can be removed in operation 304 such that the front side 110F of the substrate 110 is exposed.

Figure 6E:
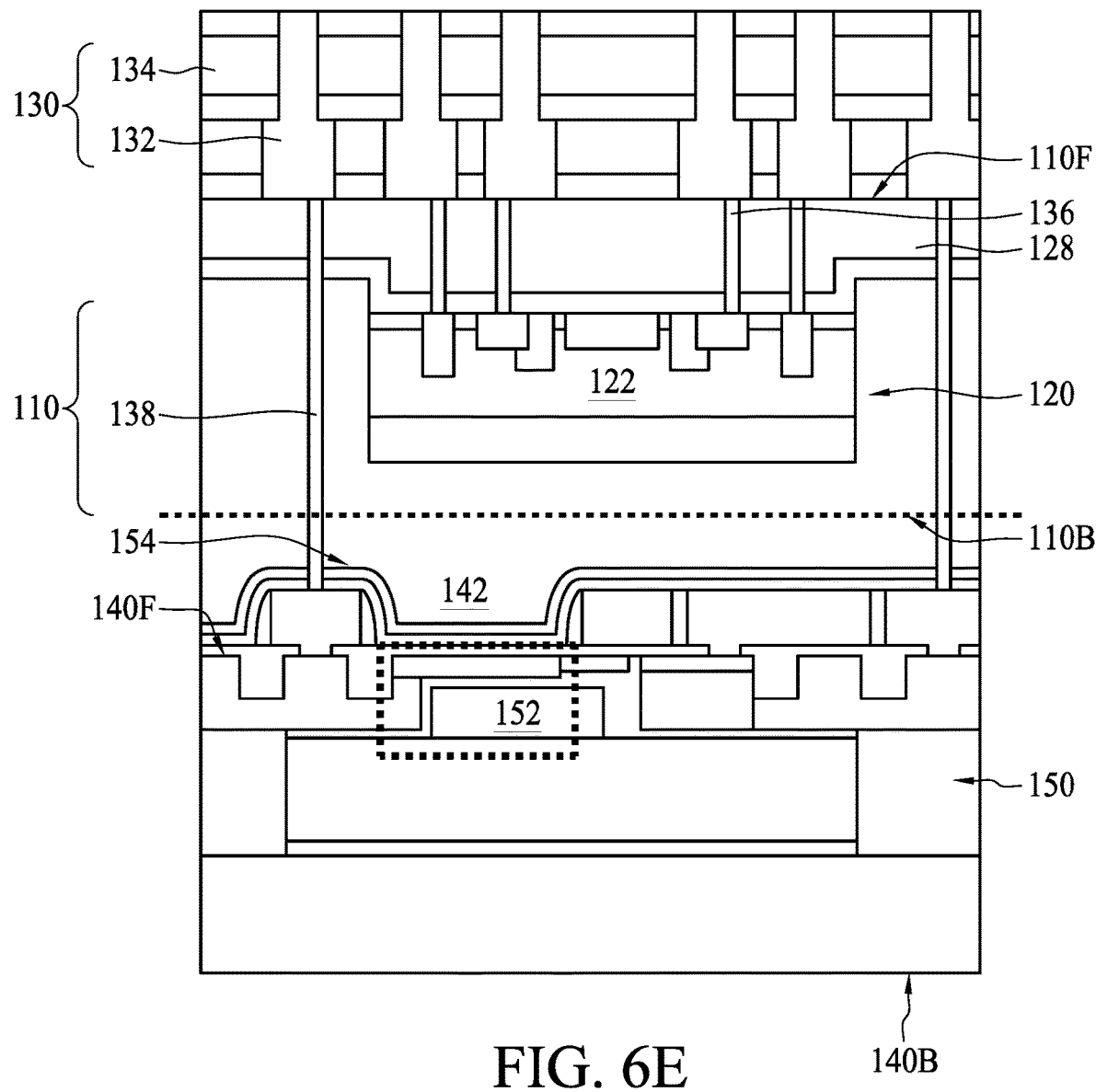

Referring to FIG. 6E, after the exposing of the front side 110F of the substrate 110, an ILD layer 128 can be formed over the front side 110F of the substrate 110, and a first connecting structure 136 penetrating the ILD layer 128 is formed to couple to the light-sensing element 120. In some embodiments, a second connecting structure 138 penetrating the ILD layer 128, the substrate 110 and a portion of the ILD layer 142 is formed to couple to the transistor 154.

In operation 305, an interconnect structure 130 is formed on the front side 110F of the substrate 110. As mentioned above, the interconnect structure 130 includes a plurality of BEOL metallization layers 132 stacked within dielectric layers 134. Referring to FIG. 6E, the light-sensing element 120 is electrically connected to the interconnect structure 130 by the connecting structure 136, while the light-sensing element 150 is electrically connected to the interconnect structure 130 by the connecting structure 138.

Figure 6F:
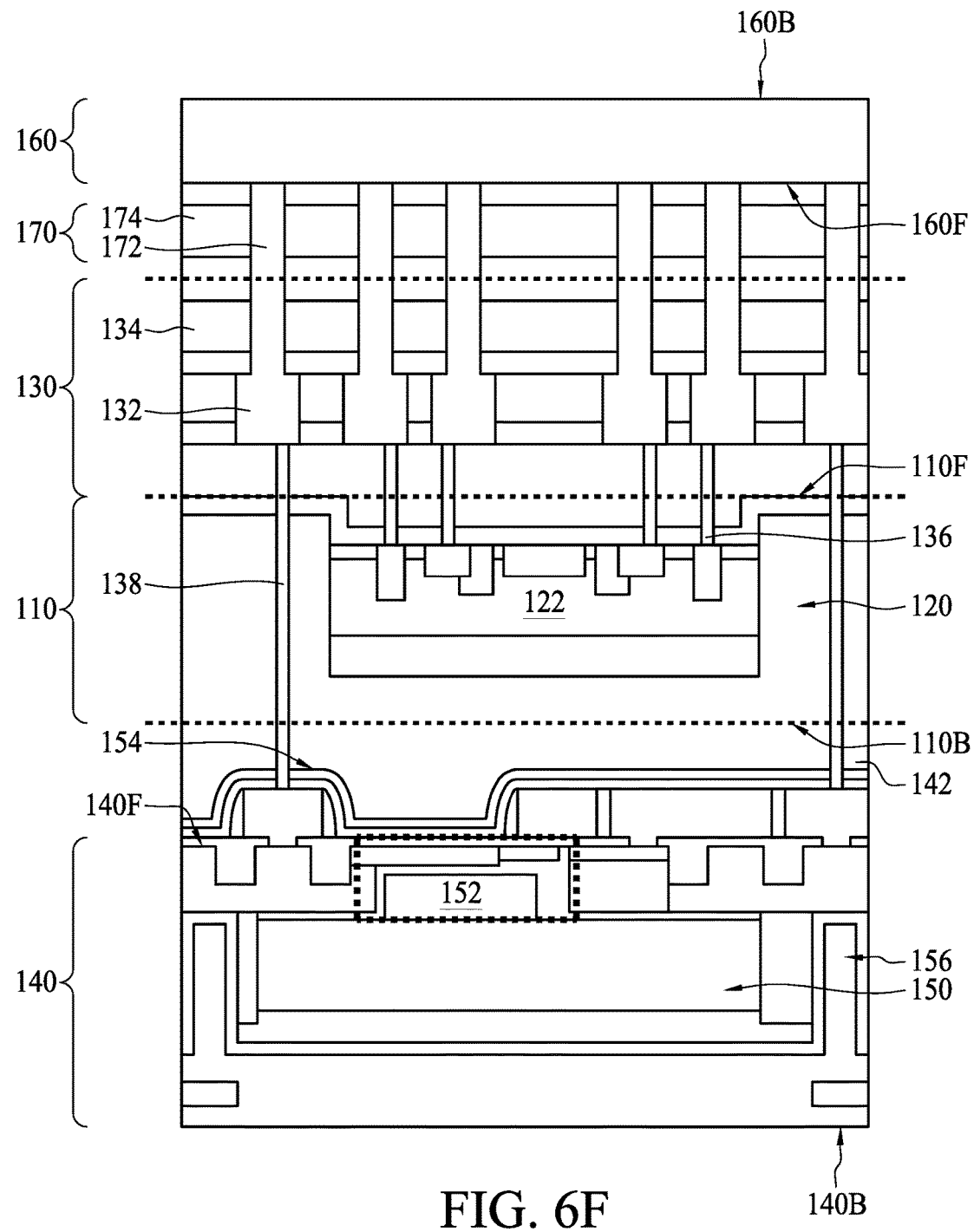

Referring to FIG. 6F, in operation 306, the substrate 110 is bonded to a substrate 160. The substrate 160 includes a front side 160F and a back side 160B opposite to the front side 160F. In some embodiments, the substrate 160 includes readout circuits, image signal processing (ISP) circuits, and/or application-specific integrated circuits (ASIC), but the disclosure is not limited thereto. In some embodiments, an interconnect structure 170 is disposed on the front side 160F of the substrate 160 and electrically connected to the circuits. As mentioned above, the interconnect structure 170 includes a plurality of BEOL metallization layers 172 stacked within dielectric layers 174.

As shown in FIG. 6F, the interconnect structure 130 is bonded to the interconnect structure 170 such that the substrate 110 is bonded to the substrate 160. In other words, by bonding the interconnect structure 130 to the interconnect structure 170, the substrate 110 is bonded to the substrate 160. In some embodiments, a bonding structure can be formed by the bonded interconnect structures 130 and 170. In some embodiments, the bonding structure can be a hybrid bonding structure including at least a metal-to-metal interface and a dielectric-to-dielectric interface. In some embodiments, the bonding structure can include a metal-to-dielectric interface.

Referring to FIG. 6F, in some embodiments, after the bonding of the substrate 110 and the substrate 160, the substrate 140 can be thinned from the back side 140B of the substrate 140. Accordingly, a thickness of the substrate 140 is reduced. As mentioned above, a plurality of isolation structures 156 such as DTI structures can be disposed in the substrate 140 to provide optical isolation between neighboring light-sensing elements 150, thereby serving as a substrate isolation grid and reducing cross-talk. Further, as mentioned above, an optical structure can be formed on the back side 140B of the substrate 140. In some embodiments, the optical structure can include a color filter and a micro-lens respectively aligned with the light-sensing element 150 and the light-sensing element 120, though not shown. Additionally, a plurality of low-n structures (not shown) can be disposed. As mentioned above, the micro-lenses (not shown) are used to focus incident light onto the corresponding light-sensing elements 150 and 120. As mentioned above, the color filter is assigned to corresponding colors or wavelengths of light, and accordingly the micro-lenses, the color filter and the second sensing device may be a part of an RGB image sensing system.

Still referring to FIG. 6F, thus, a dual-level composite semiconductor image sensor 100 including the image-capturing device (i.e., the visible-light-sensing device) and the depth-sensing device (i.e., the NIR/SWIR-sensing device) is obtained. According to the method for forming the semiconductor image sensor 30, integration of the substrate 110 including the depth-sensing device with the Ge-containing light-sensing element 120, the substrate 140 including the image-capturing device with the Si-containing light-sensing element 150, and the ASIC substrate 160 can be improved.

Figure 7:
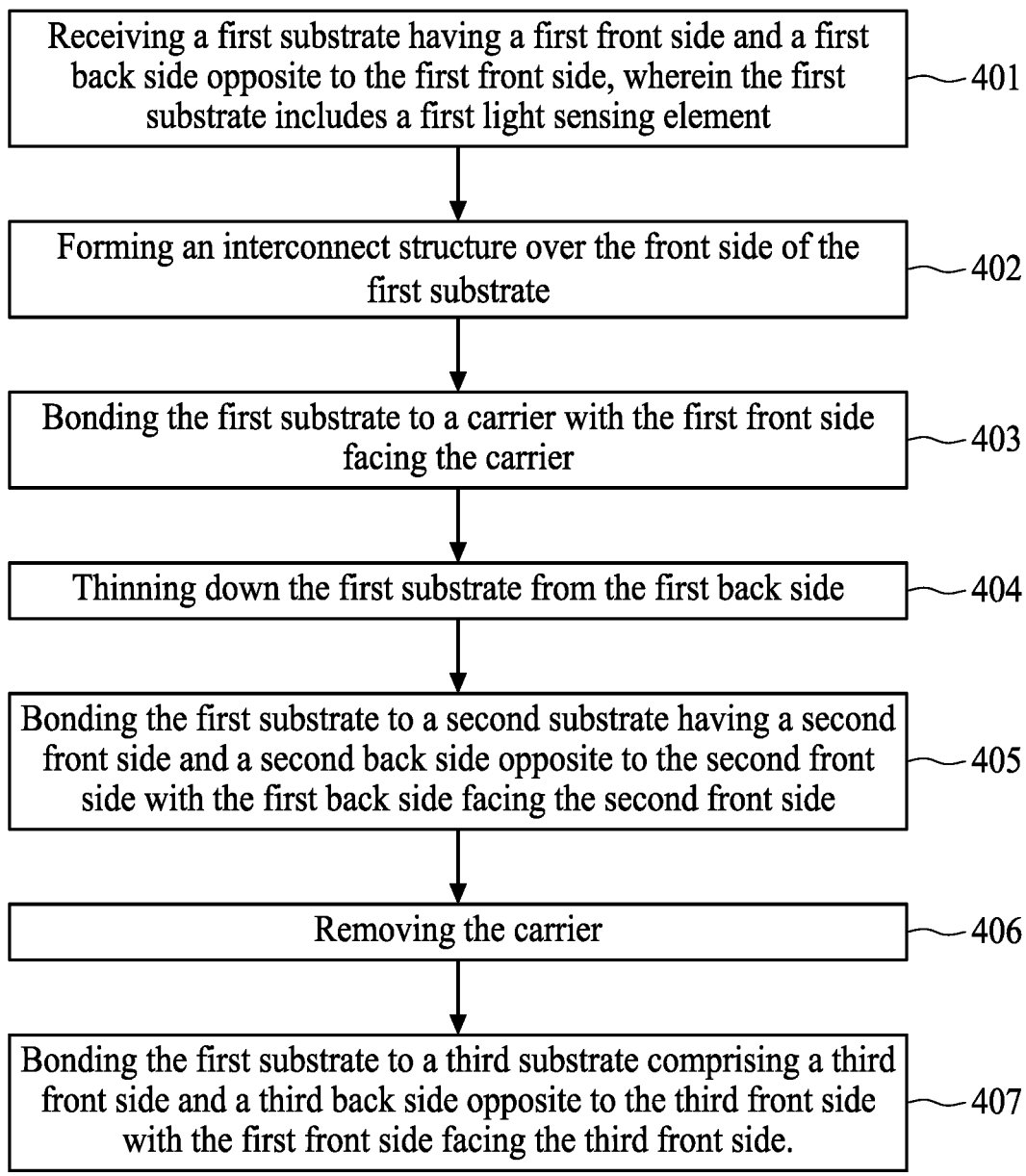
FIG. 7 shows a flowchart representing a method for forming a semiconductor image sensor according to aspects of the present disclosure.

FIG. 7 is a flowchart representing a method for forming a semiconductor image sensor 40 according to aspects of the present disclosure. In some embodiments, the method for forming the semiconductor image sensor 40 includes a number of operations (401, 402, 403, 404, 405, 406 and 407). The method for forming the semiconductor image sensor 40 will be further described according to one or more embodiments. It should be noted that the operations of the method 40 may be rearranged or otherwise modified within the scope of the various aspects. It should further be noted that additional processes may be provided before, during, and after the method 40, and that some other processes may be only briefly described herein.

FIGS. 8A to 8E are schematic drawings illustrating various stages in the method for forming the semiconductor image sensor 40 according to aspects of one or more embodiments of the present disclosure. In some embodiments, the method for forming the semiconductor image sensor 40 can be used to form the semiconductor image sensor 100, but the disclosure is not limited thereto. Therefore, same elements in FIGS. 1, 2 and 8A to 8E are indicated by the same numerals, and repeated descriptions of such elements are omitted for brevity.

Figure 8A:
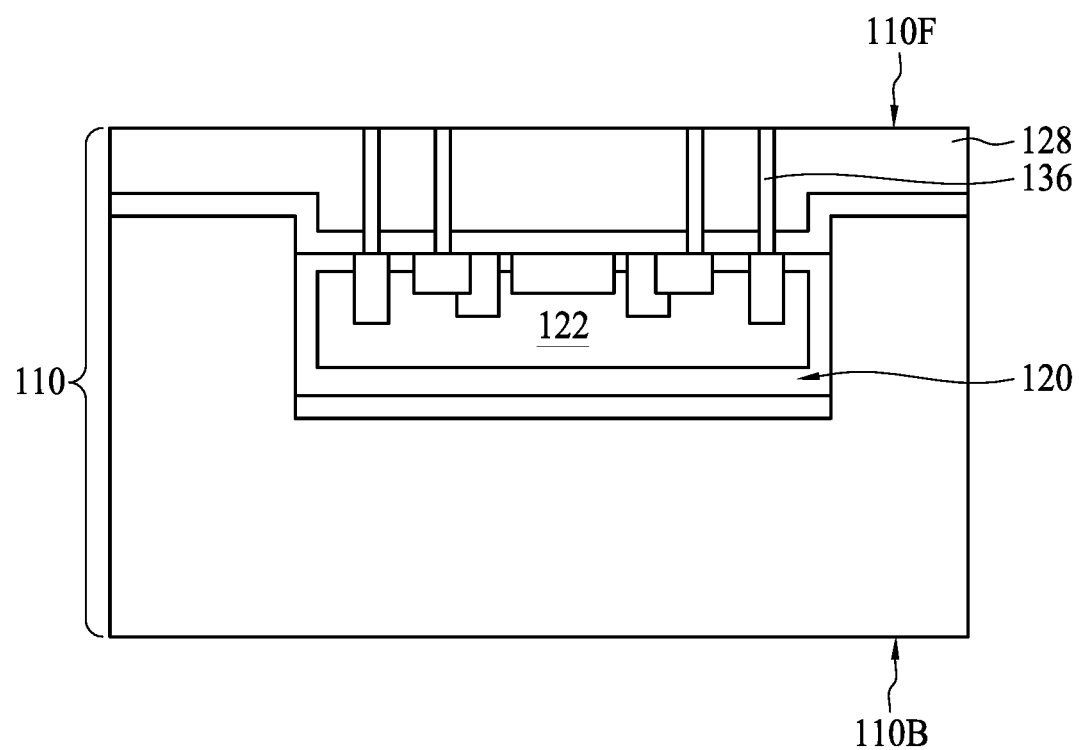
FIGS. 8A to 8E are schematic drawings of a semiconductor image sensor at various fabrication stages constructed according to aspects of the present disclosure in one or more embodiments.

In operation 401, a substrate 110 is provided or received as shown in FIG. 8A. The substrate 110 includes a front side 110F and a back side 110B opposite to the front side 110F. At least a first sensing device is formed in the substrate 110. As mentioned above, the first sensing device includes a light-sensing element 120, and the light sensing-element 120 includes a semiconductor material suitable for absorbing NIR and/or SWIR radiation. In some embodiments, the light-sensing element 120 include a germanium layer 122, as shown in FIG. 8A, but the disclosure is not limited thereto.

In some embodiments, the light-sensing element 120 including the germanium layer 122 can be formed by operations as mentioned above; therefore, repeated descriptions of such elements are omitted for brevity. Referring to FIG. 8A, the light-sensing element 120 is formed near the front side 110F of the substrate 110. In some embodiments, an ILD layer 128 can be formed over the front side 110F of the substrate 110. Further, connecting structures 136 coupled to the light-sensing element 120 can be formed in the ILD layer 128.

Figure 8B:
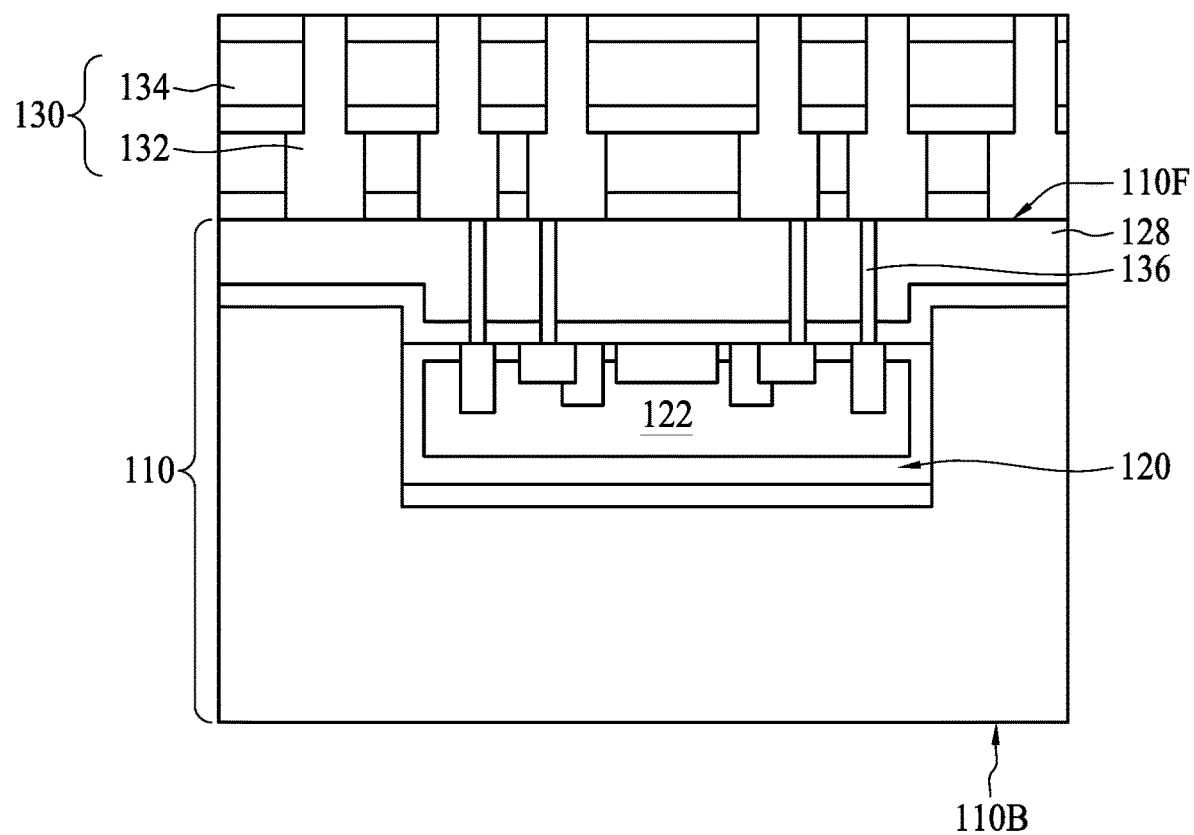

Referring to FIG. 8B, in operation 402, an interconnect structure 130 is formed over the front side 110F of the substrate 110, and over the ILD layer 128. In some embodiments, the interconnect structure 130 includes a plurality of BEOL metallization layers 132 stacked within dielectric layers 134. Further, the light-sensing element 120 is electrically connected to the interconnect structure 130 by the connecting structure 136.

Figure 8C:
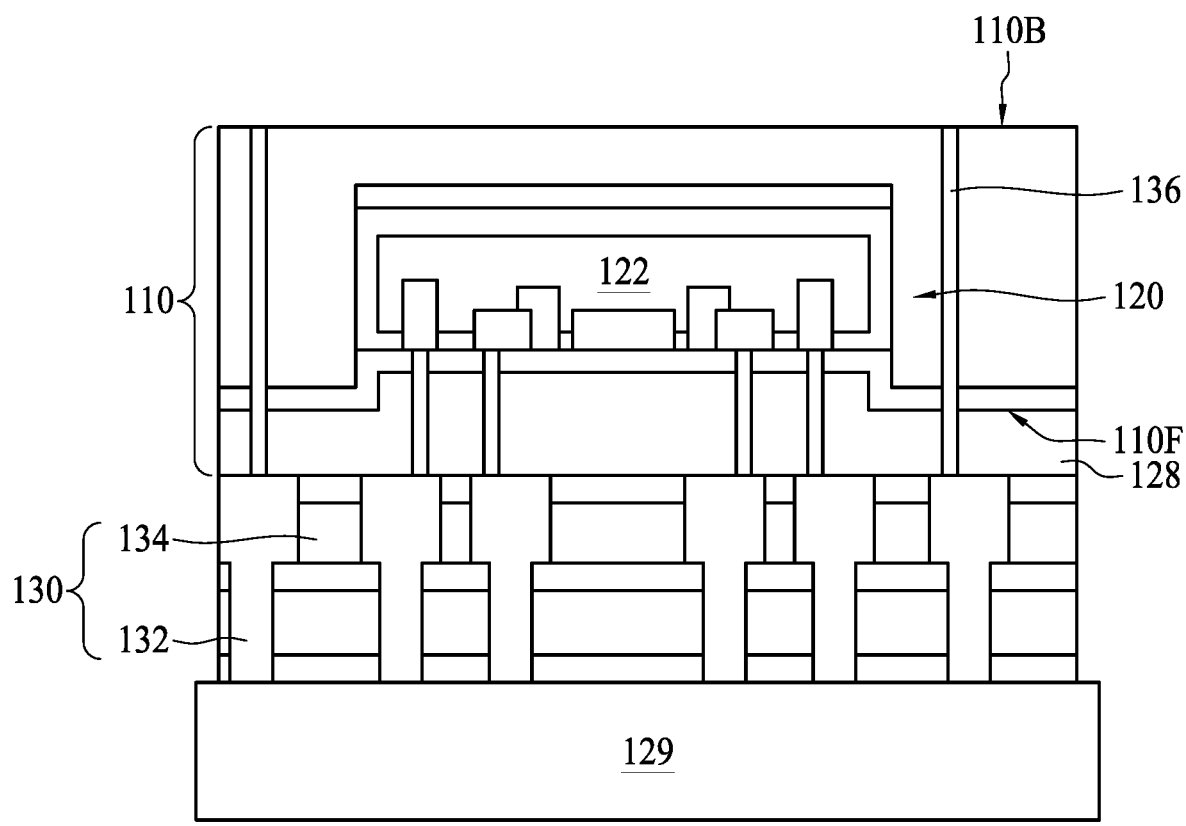

Referring to FIG. 8C, in operation 403, the substrate 110 is flipped over and bonded to a carrier 129 with the front side 110F facing the carrier 129. In operation 404, the substrate 110 is thinned from the back side 110B. In some embodiments, the silicon layer 112 can be partially removed. However, in other embodiments, the silicon layer 112 can be entirely removed such that the epitaxial silicon layer is exposed. In some embodiments, a connecting structure 136 penetrating the substrate 110 and the ILD layer 128 can be formed to couple to the interconnect structure 130.

Figure 8D:
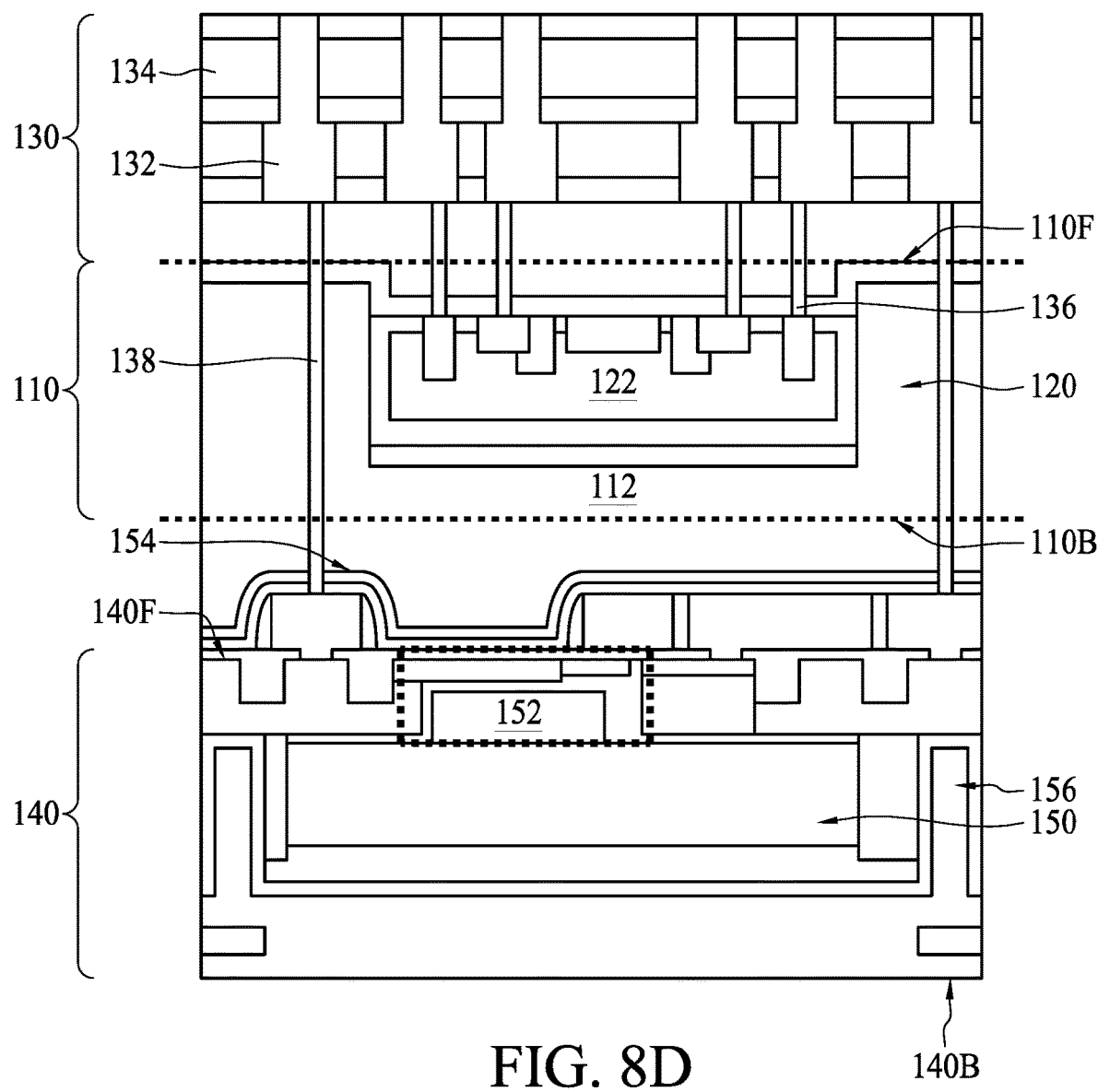

Referring to FIG. 8D, in operation 405, the substrate 110 and the carrier 129 are flipped over, and the substrate 110 is bonded to a substrate 140. The substrate 140 includes a front side 140F and a back side 140B opposite to the front side 140F. The substrate 110 is bonded to the substrate 140 with the back side 110B of the substrate 110 facing the front side 140F of the substrate 140, as shown in FIG. 8D. In some embodiments, the substrate 140 includes at least a second sensing device disposed therein. As mentioned above, the second sensing device can include a light-sensing element 150 operating to sense visible light of incident light, and the light-sensing element 150 can include a semiconductor material different from that of the light-sensing element 120 of the first sensing device. In some embodiments, the light-sensing element 150 includes a silicon layer 152, as shown in FIG. 8D. As mentioned above, in such embodiments, at least a transistor 154 can be formed over the front side 140F of the substrate 140 and configured to enable readout of the second sensing device. However, in other embodiments, the substrate 140 can include an optical structure 158 as shown in FIG. 2. In some embodiments, an ILD layer 142 can be formed over the front side 140F of the substrate 140. Further, a connecting structure coupled to the transistor 154 can be formed in the ILD layer 142.

Referring to FIG. 8D, the substrate 110 is bonded to the substrate 140 with the back side 110B of the substrate 110 facing the front side 140F of the substrate 140. Further, the connecting structure 138 in the substrate 110 can be bonded to the connecting structure in the ILD layer 142, as shown in FIG. 8D. To simplify the illustration, the connecting structure 138 includes both the connecting structure in the substrate 110 and the connecting structure in the ILD layer 142. Further, the light-sensing element 120 of the first sensing device can be aligned with the light-sensing element 150 of the second sensing device. In other embodiments, the light-sensing element 120 of the first sensing device can be aligned with the optical structure 158, as shown in FIG. 2.

Figure 8E:
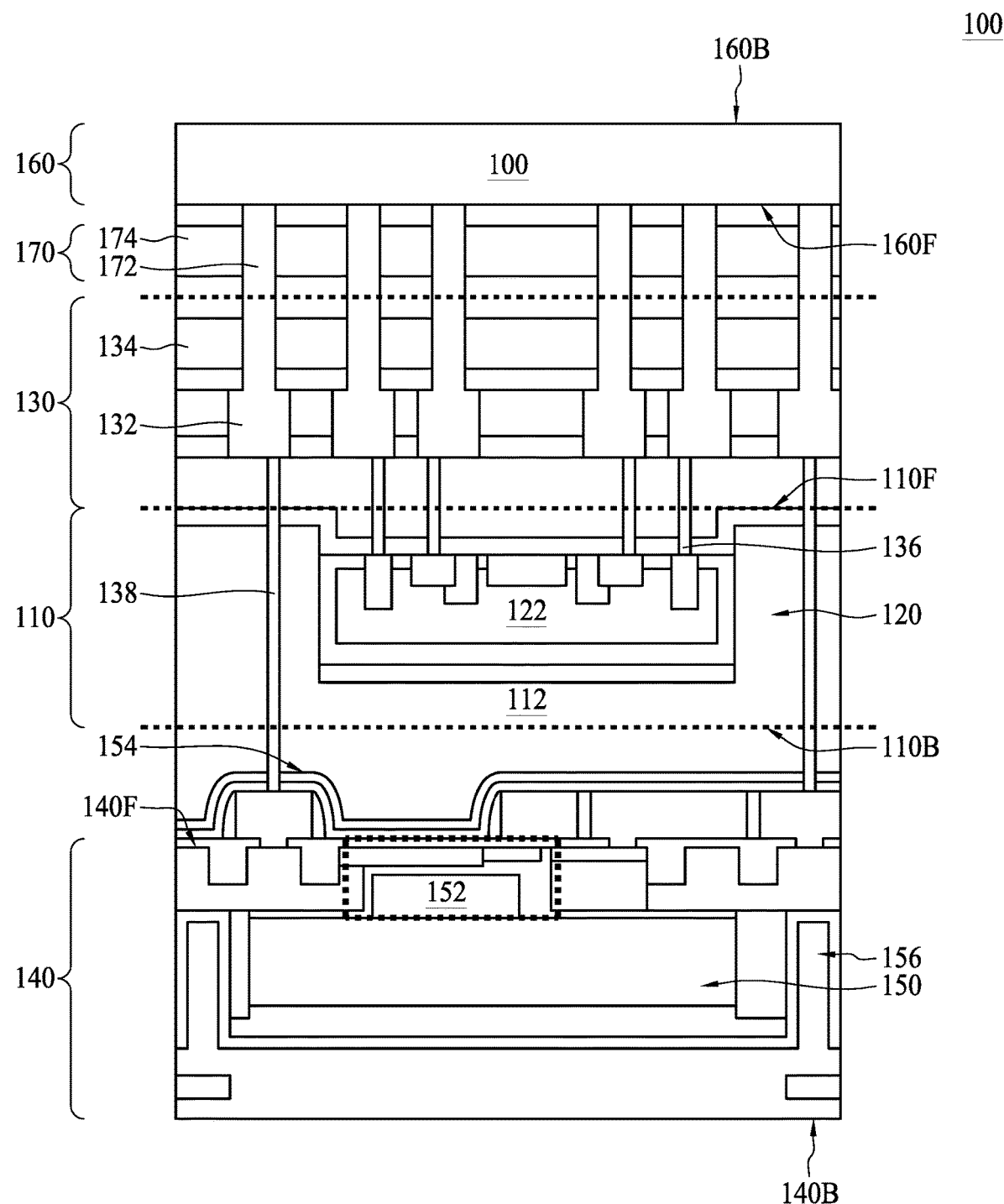

Referring to FIG. 8E, in operation 406, the carrier 129 is removed after the bonding of the substrate 110 to the substrate 140. In operation 407, the substrate 110 is bonded to a substrate 160. The substrate 160 includes a front side 160F and a back side 160B opposite to the front side 160F. In some embodiments, the substrate 160 includes readout circuits, image signal processing (ISP) circuits, and/or application-specific integrated circuits (ASIC), but the disclosure is not limited thereto. In some embodiments, an interconnect structure 170 is disposed on the front side 160F of the substrate 160 and electrically connected to the circuits. As mentioned above, the interconnect structure 170 includes a plurality of BEOL metallization layers 172 stacked within dielectric layers 174.

As shown in FIG. 8E, the interconnect structure 130 is bonded to the interconnect structure 170 such that the substrate 110 is bonded to the substrate 160. In other words, by bonding the interconnect structure 130 to the interconnect structure 170, the substrate 110 is bonded to the substrate 160. In some embodiments, a bonding structure can be formed by the bonded interconnect structures 130 and 170. In some embodiments, the bonding structure can be a hybrid bonding structure including at least a metal-to-metal interface and a dielectric-to-dielectric interface. In some embodiments, the bonding structure can include a metal-to-dielectric interface.

In some embodiments, another thinning operation can be performed to thin the substrate 140 from the back side 140B after the bonding of the substrate 110 to the substrate 140. Accordingly, a thickness of the substrate 140 is reduced. As mentioned above, a plurality of isolation structures 156 such as DTI structures can be disposed in the substrate 140 to provide optical isolation between neighboring light-sensing elements 150, thereby serving as a substrate isolation grid and reducing cross-talk.

In some embodiments, an optical structure can be formed on the back side 140B of the substrate 140. In some embodiments, the optical structure can include a color filter and a micro-lens respectively aligned with the light-sensing element 150 and the light-sensing element 120, though not shown. Additionally, a plurality of low-n structures (not shown) can be disposed. As mentioned above, the micro-lenses (not shown) are used to focus incident light onto the corresponding light-sensing elements 150 and 120. As mentioned above, the color filter is assigned to corresponding colors or wavelengths of light, and accordingly the microlenses, the color filter and the second sensing device may be a part of an RGB image sensing system.

Still referring to FIG. 8E, thus, a dual-level composite semiconductor image sensor 100 including the image-capturing device (i.e., the visible-light-sensing device) and the depth-sensing device (i.e., the NIR/SWIR-sensing device) is obtained. According to the method for forming the semiconductor image sensor 40, integration of the substrate 110 including the depth-sensing device with the Ge-containing light-sensing element 120, the substrate 140 including the image-capturing device with the Si-containing light-sensing element 150, and the ASIC substrate 160 can be improved.

In summary, the present disclosure provides a composite semiconductor image sensor including an image-capturing device and a depth-sensing device. In some embodiments, the image-capturing device includes visible-light-sensing devices while the depth-sensing device includes NIR/SWIR-sensing devices. Further, the visible-light-sensing device uses a first semiconductor material such as silicon ensuring a greater absorption of the visible light, while the NIR/SWIR-sensing devices use a second semiconductor material such as germanium providing greater absorption of NIR/SWIR radiation. The present disclosure further provides a method for forming the semiconductor image sensor that improves integration of the image-capturing devices and the depth-sensing devices.

In some embodiments, a semiconductor image sensor is provided. The semiconductor image sensor includes a first substrate including a first front side and a first back side opposite to the first front side, a second substrate including a second front side and a second back side opposite to the second front side, a third substrate including a third front side and a third back side opposite to the third front side, and a first interconnect structure and a second interconnect structure. In some embodiments, the first substrate includes a layer including a first semiconductor material and a first light-sensing element in the layer. In some embodiments, the first light-sensing element includes a second semiconductor material different from the first semiconductor material. The second substrate is bonded to the first substrate with the second front side of the second substrate facing the first back side of the first substrate. The third substrate is bonded to the first substrate with the third front side of the third substrate facing the first front side of the first substrate. The first interconnect structure and the second interconnect structure are disposed between the first front side of the first substrate and the third front side of the third substrate.

In some embodiments, a method for forming a semiconductor image sensor is provided. The method includes following operations. A first substrate including a first front side and a first back side opposite to the front side is received. The first substrate includes a first light-sensing element and a first interconnect structure disposed over the first front side of the first substrate. A second substrate including a second front side and a second back side opposite to the second front side is received. The second substrate includes a second interconnect structure disposed over the second front side of the second substrate. The first interconnect structure and the second interconnect structure are bonded. The first substrate is bonded to a third substrate including a third front side and a third back side opposite to the third front side with the first back side of the first substrate facing the third front side of the third substrate. In some embodiments, the first light-sensing element includes a first semiconductor material.

In some embodiments, a method for forming a semiconductor image sensor is provided. The method includes following operations. A first substrate including a first front side and a first back side opposite to the first front side is received. The first substrate includes a first light-sensing element. The first substrate is bonded to a second substrate including a second front side and a second back side opposite to the second front side with the first back side of the first substrate facing the second front side of the second substrate. The first substrate is bonded to a third substrate including a third front side and a third back side opposite to the third front side with the first front side of the first substrate facing the third front side of the third substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor image sensor comprising:
   receiving a first substrate comprising a first front side and a first back side opposite to the first front side, wherein the first substrate includes a first light-sensing element;
   bonding the first substrate to a carrier with the first front side facing the carrier;
   thinning the first substrate from the first back side;
   bonding the first substrate to a second substrate comprising a second front side and a second back side opposite to the second front side with the first back side of the first substrate facing the second front side of the second substrate, wherein the second substrate includes a second light-sensing element;
   removing the carrier;
   forming a first interconnect structure over the first front side of the first substrate;
   forming a first connecting structure coupled to the first light-sensing element, and a second connecting structure coupled to the second light-sensing element; and
   bonding the first substrate to a third substrate comprising a third front side and a third back side opposite to the third front side with the first front side of the first substrate facing the third front side of the third substrate, wherein the third substrate comprises a second interconnect structure.

2. The method of claim 1, wherein the second substrate comprises an optical structure substantially aligned with the first light-sensing element.

3. The method of claim 1, wherein the second light-sensing element comprise a semiconductor material different from a semiconductor material of the first light-sensing element.

4. The method of claim 3, wherein the semiconductor material of the first light-sensing element comprises germanium, and the semiconductor material comprises silicon of the second light-sensing element.

5. The method of claim 1, wherein the first substrate and the third substrate are bonded by bonding the first interconnect structure to the second interconnect structure.

6. A method for forming a semiconductor image sensor comprising:
receiving a first substrate comprising a first front side and a first back side opposite to the first front side, wherein the first substrate includes a first light-sensing element;
bonding the first substrate to a carrier with the first front side facing the carrier;
bonding the first substrate to a second substrate comprising a second front side and a second back side opposite to the second front side with the first back side of the first substrate bonding to the second front side of the second substrate, wherein the second substrate includes a second light-sensing element and a transistor disposed between the first light-sensing element and the second light-sensing element;
removing the carrier; and
bonding the first substrate to a third substrate comprising a third front side and a third back side opposite to the third front side with the first front side of the first substrate facing the third front side of the third substrate.

7. The method of claim 6, wherein the first light-sensing element comprises a first semiconductor layer, the second light-sensing element comprises a second semiconductor layer different from the first semiconductor layer.

8. The method of claim 7, wherein the first semiconductor layer comprises germanium, and the second semiconductor layer comprises silicon.

9. The method of claim 6, wherein the third substrate comprises a first interconnect structure disposed over the third front side.

10. The method of claim 9, further comprising forming a second interconnect structure over the first front side of the first substrate.

11. The method of claim 10, wherein the bonding of the first substrate to the third substrate comprises bonding the first interconnect structure to the second interconnect structure.

12. A method for forming a semiconductor image sensor comprising:
receiving a first substrate comprising a first front side and a first back side opposite to the first front side;
bonding the first front side of the first substrate to a carrier;
bonding the first substrate to a second substrate comprising a second front side and a second back side opposite to the second front side with the first back side of the first substrate bonding to the second front side of the second substrate;
removing the carrier to expose the first front side of the first substrate;
forming a first interconnect structure over the first front side of the first substrate after the removing of the carrier; and
bonding the first substrate to a second interconnect structure of a third substrate, wherein the third substrate comprises a third front side and a third back side opposite to the third front side, and the second interconnect structure is disposed over the third front side of the third substrate.

13. The method of claim 12, further comprising thinning the first substrate from the first back side prior to the removing of the carrier.

14. The method of claim 12, wherein the second first substrate comprises a first light-sensing element, and the second substrate comprises a second light-sensing element.

15. The method of claim 14, wherein the first light-sensing element comprises a first semiconductor layer, and the second light-sensing element comprises a second semiconductor layer different from the first semiconductor layer.

16. The method of claim 15, wherein the first semiconductor layer comprises germanium, and the second semiconductor layer comprises silicon.

17. The method of claim 12, wherein the bonding of the first substrate to the carrier comprises bonding an oxide layer over the first front side of the first substrate to the carrier.

18. The method of claim 17, wherein the removing of the carrier further comprising removing the oxide layer to expose the first front side of the first substrate.

19. The method of claim 1, wherein the first light-sensing element is electrically connected to the first interconnect structure by the first connecting structure.

20. The method of claim 1, wherein the second light-sensing element is electrically connected to the first interconnect structure by the second connecting structure.

* * * * *